US012765133B2

(12) United States Patent
Han et al.

(10) Patent No.: US 12,765,133 B2
(45) Date of Patent: Oct. 13, 2026

(54) Mn(VI)-ACTIVATED OXIDOFLUORIDES AS LUMINESCENT MATERIALS FOR SOLID STATE LIGHT SOURCES

(71) Applicants: Seoul Semiconductor Co., Ltd., Ansan-si (KR); LITEC-VERMÖGENSVERWALTUNGSGESELLSCHAFT MBH, Greifswald (DE)

(72) Inventors: Bo Yong Han, Ansan-si (KR); Stefan Tews, Greifswald (DE); Mathias Rapphahn, Greifswald (DE); Benjamin Kistner, Sundhagen (DE)

(73) Assignees: Seoul Semiconductor Co., Ltd., Ansan-si (KR); LITEC-VERMOGENSVERWALTUNGSGESELLSCHAFT MBH, Greifswald (DE)

( * ) Notice: Subject to any disclaimer, the term of this patent is extended or adjusted under 35 U.S.C. 154(b) by 668 days.

(21) Appl. No.: 18/116,847

(22) Filed: Mar. 3, 2023

(65) Prior Publication Data

US 2023/0279292 A1 Sep. 7, 2023

Related U.S. Application Data

(60) Provisional application No. 63/316,520, filed on Mar. 4, 2022.

(51) Int. Cl.

| | |
|---|---|
| ***H10H 20/851*** | (2025.01) |
| ***C09K 11/02*** | (2006.01) |
| ***C09K 11/61*** | (2006.01) |

(52) U.S. Cl.

CPC ....... *H10H 20/8512* (2025.01); *C09K 11/025* (2013.01); *C09K 11/616* (2013.01); *H10H 20/8515* (2025.01); *H10H 20/8513* (2025.01)

(58) Field of Classification Search

CPC ................ C09K 11/025; C09K 11/616; H10H 20/8512; H10H 20/8513; H10H 20/8515

See application file for complete search history.

(56) References Cited

U.S. PATENT DOCUMENTS

| | | | | |
|---|---|---|---|---|
| 8,906,724 | B2 | 12/2014 | Murphy et al. | |
| 2014/0327026 | A1* | 11/2014 | Murphy | H10H 20/852 252/301.4 F |
| 2014/0369036 | A1 | 12/2014 | Feng | |
| 2018/0149802 | A1 | 5/2018 | Krames et al. | |
| 2019/0048258 | A1* | 2/2019 | Du | C09K 11/02 |
| 2021/0024824 | A1 | 1/2021 | Jansen et al. | |

FOREIGN PATENT DOCUMENTS

| | | | |
|---|---|---|---|
| CN | 107043624 | * | 8/2017 |
| CN | 107779191 | * | 3/2018 |
| CN | 110240895 | * | 9/2019 |
| CN | 110724529 | * | 1/2020 |
| CN | 111518551 | | 8/2020 |
| WO | 2014-152787 | | 9/2014 |

OTHER PUBLICATIONS

Zhou et al, "Unveiling Mn4+ substitution in oxyfluoride phosphor Rb2MnO2F4:Mn4+ applied to wide-gamut fast-response backlight displays", Chemical Engineering Journal, 413 (2021), 128974, pp. 1-7, Feb. 16, 2021.*

Zhou, Y. et al., "Unveiling Mn4+ substitution in oxyfluoride phosphor Rb2MoO2F4: Mn4+ applied to wide-gamut fast-response backlight displays", Chemical Engineering Journal, 2021, vol. 415, Article No. 129874, p. 1-.

International Search report dated Jun. 15, 2023, issued to PCT/KR2023/003042.

Extended European Search Report dated Mar. 26, 2026, in European Application No. 23763769.9 filed Mar. 6, 2023.

* cited by examiner

*Primary Examiner* — C Melissa Koslow

(74) *Attorney, Agent, or Firm* — Oblon, McClelland, Maier & Neustadt, L.L.P.

(57) ABSTRACT

A compound of the general formula $A_2N_{1-x}M_xO_{2x}X_{6-2x}$ doped with Mn(IV), in which A is selected from the group consisting of Li, Na, K, Rb, Cs, Cu, Ag, Tl, $NH_4$ or a combination thereof, N is selected from the group consisting of Si, Ge, Sn, Ti, Pb, Ce, Zr, Ru, Ir, Pr and/or Hf or a combination thereof, M is selected from the group consisting of W, Cr, Mo, Te and/or Re or a combination thereof, X is selected from the group consisting of F, Cl, Br, I or a combination thereof, and $0<x\leq1$.

10 Claims, 13 Drawing Sheets

Mn(VI)-ACTIVATED OXIDOFLUORIDES AS LUMINESCENT MATERIALS FOR SOLID STATE LIGHT SOURCES

CROSS REFERENCE TO RELATED APPLICATION

This application claims the benefit of U.S. Provisional Patent Application No. 63/316,520, filed on Mar. 4, 2022, which is hereby incorporated by reference for all purposes as if fully set forth herein.

BACKGROUND

Field

For more than 100 years, inorganic luminophores have been developed in order to spectrally adjust light emitting display screens, X-ray boosters, and radiation or light sources such that they optimally meet the demands of the respective fields of use and at the same time consuming a minimum amount of energy. In this context, the type of excitation and the emission spectrum required are of crucial significance for the selection of the host lattices and the activators.

Particularly for fluorescent light sources for general lighting e.g., gas discharge lamps and light emitting diodes (LED), novel luminophores are constantly being developed in order to further increase energy efficiency, color rendering properties, and color stability as well as the lifetime of such light emitting devices. Especially LEDs have replaced traditional fluorescent and incandescent lamps in most applications.

Red emitting phosphors are widely used in LED e.g., nitrides, sulfides, or fluorides. However, many of these materials emit some portion in the deep red optical spectrum and show instability in high temperature and high humidity conditions. Therefore, it is of importance to develop new narrow red emitting luminophores to meet the requirements of the future.

The above information disclosed in this Background section is only for understanding of the background of the inventive concepts, and, therefore, it may contain information that does not constitute prior art.

SUMMARY

Exemplary embodiments of the invention relate generally to Mn(IV) activated luminescent materials, to a process for preparation thereof, and to the use thereof as luminophores or conversion phosphors or light conversion materials, especially in light emitting devices, such as phosphor converted light emitting diodes (pc-LEDs).

Additional features of the inventive concepts will be set forth in the description which follows, and in part will be apparent from the description, or may be learned by practice of the inventive concepts.

Exemplary embodiments further relate to a radiation converting mixture including the luminescent material according to exemplary embodiments and a light source including the luminescent material according to exemplary embodiments or the radiation converting mixture.

Exemplary embodiments further provide a lighting unit including a light source with the luminescent material according to exemplary embodiments or the radiation-converting mixture according to exemplary embodiments. The luminescent materials according to exemplary embodiments are especially suitable for the creation of white light in LED-based solid state light sources.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

BRIEF DESCRIPTION

Figure 1:
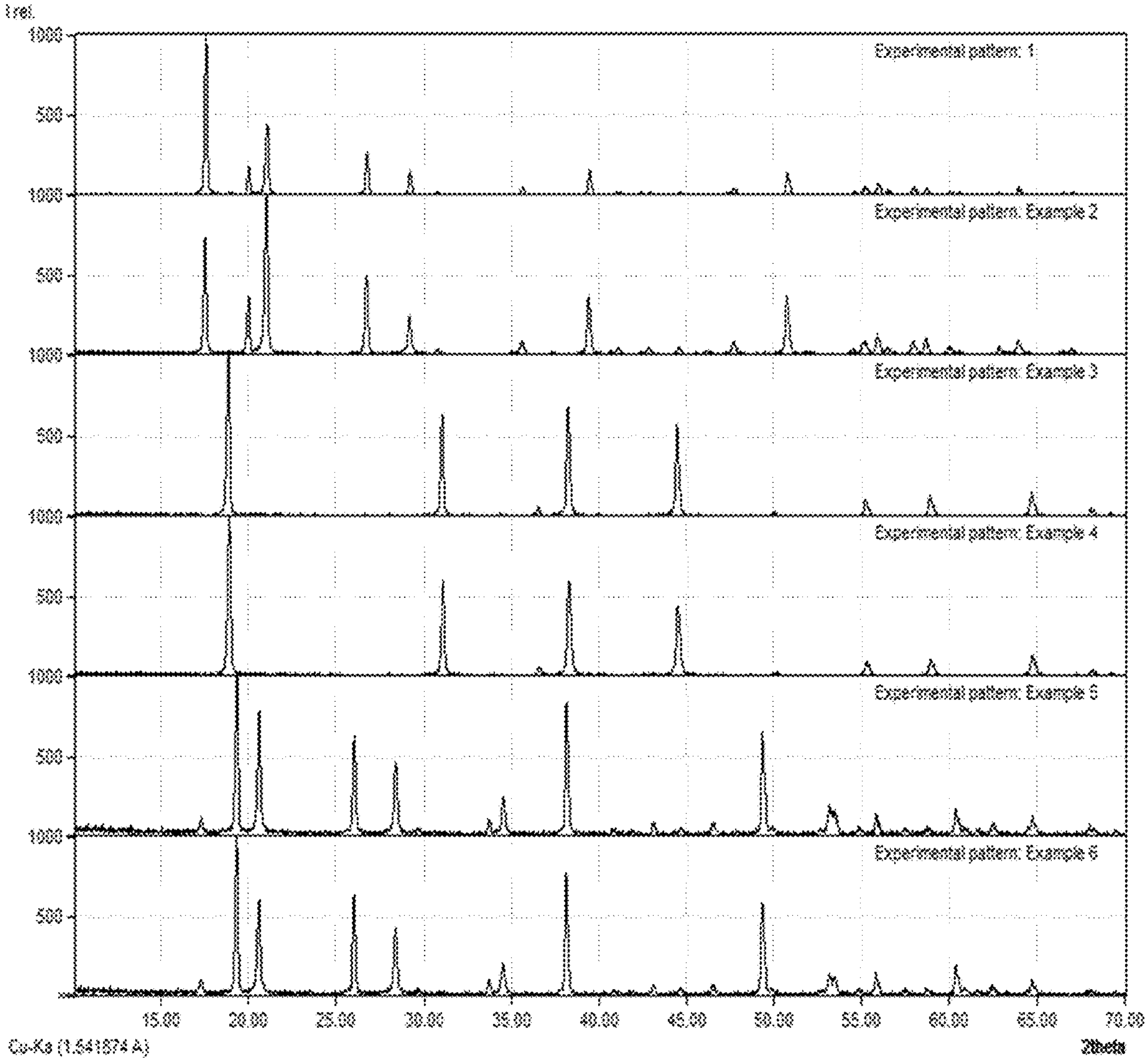
FIG. 1 show XRD Pattern of Examples 1 to 6.
Figure 2:
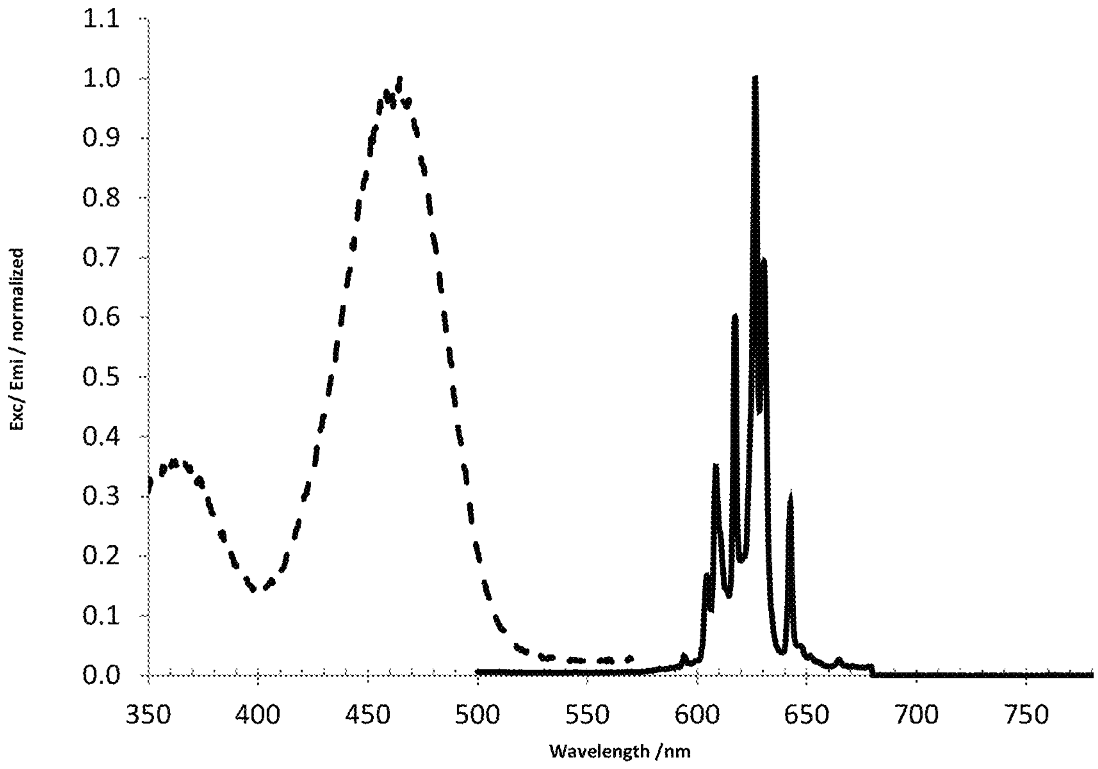
FIG. 2 shows excitation and emission spectrum of Example 2.
Figure 3:
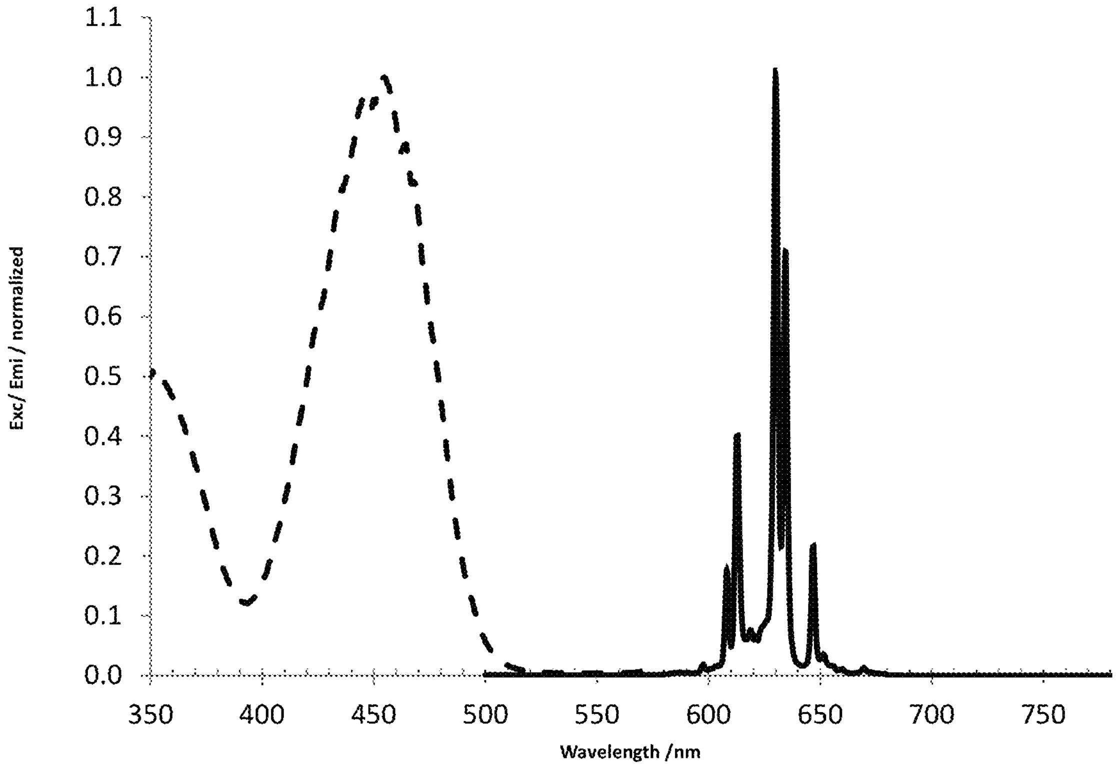
FIG. 3 shows excitation and emission spectrum of Example 3.
Figure 4:
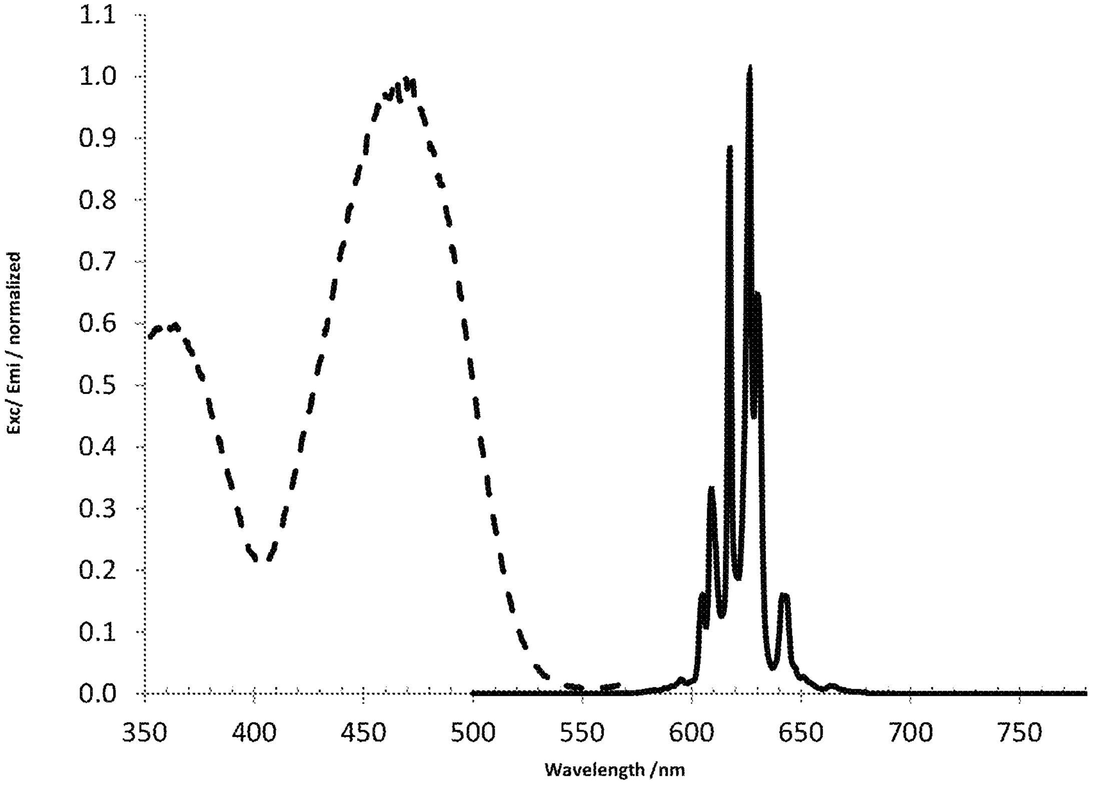
FIG. 4 shows excitation and emission spectrum of Example 5.
Figure 5A:
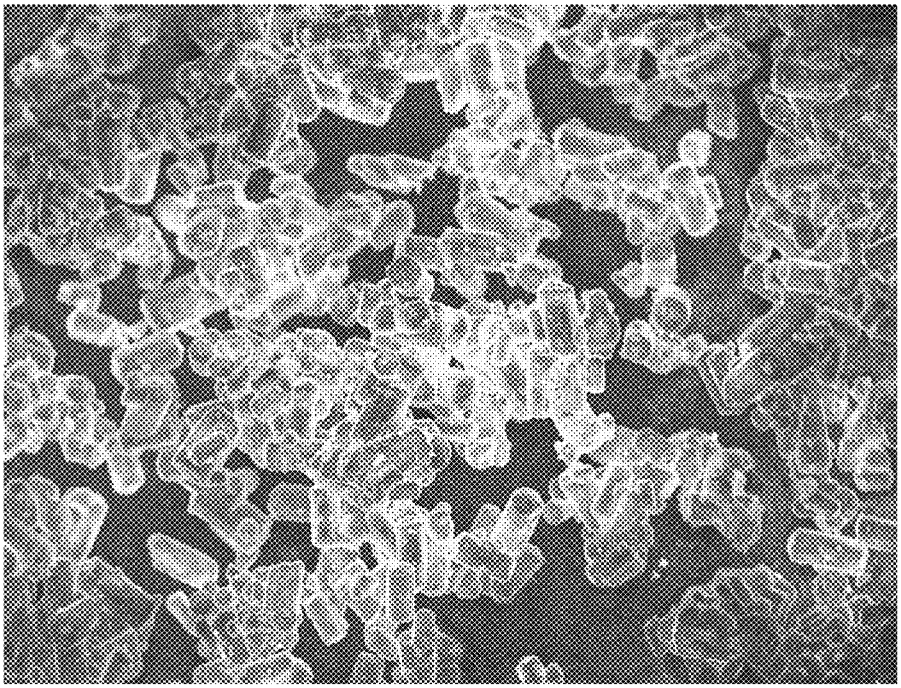
FIGS. 5A and 5B are REM of Example 5 and EDX of Tungsten (W).
Figure 5B:
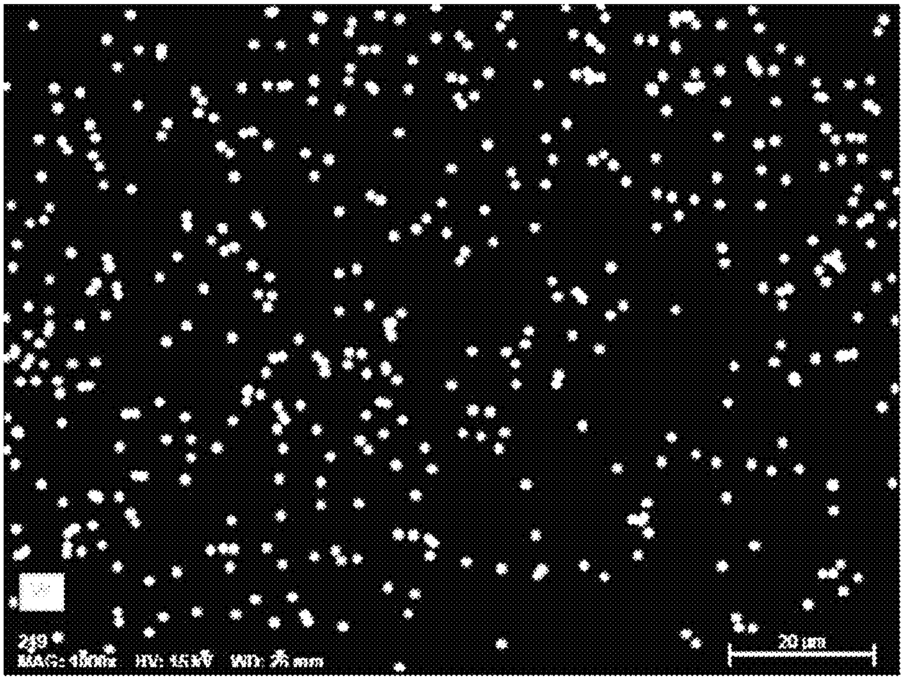

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly in coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments provide luminescent materials with prolonged stability, which have intense luminescent brightness in the red spectral region and are especially suitable for the use in phosphor converted LEDs or films for the generation of white light or different color. As such, a greater selection of suitable materials for the production of light emitting devices, e.g., warm white LED, may be provided.

Exemplary embodiments also provide novel luminescent materials that feature a broad absorption cross section in the near UV to blue spectral region, have an emission maximum in the red spectral region between 610 and 640 nm, and are thus suitable for use as conversion luminophores in LEDs with improved luminous efficiency and color rendering properties.

Exemplary embodiments further provide luminescent materials with high luminous efficiency, high color stability, long lifetime, and high light conversion efficiency that are readily obtainable by a simple and inexpensive synthesis. In this manner, it possible to implement white LED with high color rendering values at low color temperatures (CCT<5000 K) with simultaneously high light yield.

Exemplary embodiments provide Mn(IV)-activated luminescent materials based on an Oxidohalide host lattice of the general formula (II) $A_2N_{1-x-y}M_xO_{2x}X_{6-2x}$:Mn(VI)$_y$, where A is at least one selected from the group consisting of Li, Na, K, Rb, Cs, Cu, Ag, Tl, and $NH_4$; M is at least one selected from the group consisting of W, Cr, Mo, Te, and Re; N is at least one selected from the group consisting of Si, Ge, Sn, Ti, Pb, Ce, Zr, Ru, Ir, Pr, and Hf; 0<x≤1; 0<y≤0.5; x+y<1; X is at least one selected from the group consisting of F, Cl, Br, and I.

Surprisingly, the inventors have found that red-emitting luminescent materials having an emission maxima in the range between 610 and 640 nm, high quantum yield and luminous efficiency, high color rendering, long lifetime, and high stability of color temperature can be implemented by incorporating Mn(IV) ions into the Oxidohalide host lattice of the general formula: $A_2N_{1-x}M_xO_{2x}X_{6-2x}$ (I), where A is at least one selected from the group consisting of Li, Na, K, Rb, Cs, Cu, Ag, Tl, and $NH_4$; N is at least one selected from the group consisting of W(VI), Cr(VI), Mo(VI), Te(VI), and Re(VI); M is at least one selected from the group consisting of Si(IV), Ge(IV), Sn(IV), Ti(IV), Pb(IV), Ce(IV), Zr(IV), Ru(IV), Ir(IV), Pr(IV), and Hf(IV), and X is at least one selected from the group consisting of F, Cl, Br, and I, where 0<x≤1, so as to obtain compounds of the general composition $A_2N_{1-x-y}M_xO_{2-2x}X_{6-2x}$:Mn(VI)$_y$ with 0<y≤0.5 and x+y=1.

Furthermore, the luminescent materials are obtainable efficiently and inexpensively by a simple synthesis, particular options being Cr(VI), Mo(VI), W(VI), Te(VI), Re(VI), Si(IV), Ge(IV), Sn(IV), Ti(IV), Pb(IV), Ce(IV) Zr(IV), Ir, Pr, and/or Hf(IV) in order to obtain fluoride compounds with prolonged stability, since the corresponding Oxidohalide complex anions of the general formula $[N_{1-x-y}M_xO_{2x}X_{6-2x}]^{2-}$ showing an exceptionally high stability. In the case of microscale powders of the luminescent materials according to exemplary embodiments, there is thus no darkening since there is no formation of $MnO_2$. Moreover, the Oxidohalides according to exemplary embodiments have greater stability and luminous efficiency owing to their higher lattice energy and short red emission maxima compared to other halides e.g., pure fluoride lattices like the common $K_2SiF_6$:Mn.

The tetravalent Mn(IV), Si(IV), Ge(IV), Sn(IV), Ti(IV), Pb(IV), Ce(IV), Ru(IV), Ir(IV), Pr(IV), Zr(IV) and/or Hf(VI) ions are incorporated in the crystallographic layers of the hexavalent Metal ions (W(VI), Cr(VI), Mo(VI), Te(VI) and/or Re(VI)). Substitution with tetravalent ions leads to a simple and efficient synthesis since the tetravalent ions are inserted efficiently into the crystal structure of the host lattice. The charge is balanced by incorporation of oxide anions in the host lattice.

Compounds of this general composition are red-emitting Mn(IV) activated luminescent materials, the emission show multiple lines in the red spectral region with a maximum between 610 and 640 nm, especially in the range between 620 and 630 nm.

Moreover, the compounds according to exemplary embodiments are suitable for use as conversion luminophores in solid-state radiation sources of any kind, for example LED light sources or high-performance LED light sources. The CIE1931 color coordinates for all materials claimed here are x>0.66 and y<0.33 and the lumen equivalent is higher than 200 lm/W, preferably higher than 220 lm/W.

In the general formula $A_2N_{1-x-y}M_xO_{2x}X_{6-2x}$:Mn(IV)$_y$, A is a singly charged metal and/or ammonium cation $A^+$. M is a hextuply charged metal atom $M^{6+}$. N is present as a quadruply charged metal atom $N^{4+}$, while Halogene X is present as mostly preferred Fluoride ions (F) and Oxygen as Oxide ions ($O^{2-}$), Mn is present as a quadruply charged metal atom $Mn^{4+}$ in the group of $N^{4+}$ metals. The Mn(IV)-activated luminescent materials according to exemplary embodiments are light conversion materials, where one $M^{6+}$ ion and two $O^{2-}$ ions replace one $N^{4+}$ ion and 2 $F^-$ ions. The charge is thus balanced by the additional incorporation of two Oxide ions.

The compounds according to exemplary embodiments are typically excitable in the spectral range from about 250 to about 550 nm, preferably from about 325 to about 525 nm, where the absorption maximum is between 425 and 500 nm, and typically emit in the red spectral region from about 600 to about 650 nm, where the emission maximum is in the range between 610 and 640 nm, preferably between 620 and 635 nm. The compounds according to exemplary embodiments additionally show a high photoluminescence quantum yield and have high spectral purity and high stability of color coordinate when used in an LED.

As used herein, ultraviolet light refers to light having an emission maximum between 100 and 399 nm, violet light to that having an emission maximum between 400 and 430 nm, blue light to that having an emission maximum between 431 and 480 nm, cyan light to that having an emission maximum between 481 and 510 nm, green light to that having an emission maximum between 511 and 565 nm, yellow light to that having an emission maximum between 566 and 575 nm, orange light to that having an emission maximum between 576 and 600 nm, and red light to that having an emission maximum between 601 and 750 nm.

The Mn(IV)-doped compounds according to an exemplary embodiment are represented by the following general formula (II):

$A_2N_{1-x-y}M_xO_{2x}X_{6-2x}$:Mn(VI)$_y$ (II), where the symbols and indices used are as follows: A is at least one selected from the group consisting of Li, Na, K, Rb, Cs, Cu, Ag, Tl, and $NH_4$; M is at least one selected from the group consisting of W, Cr, Mo, Te, and Re; N is at least one selected from the group consisting of Si, Ge, Sn, Ti, Pb, Ce, Zr, Ru, Ir, Pr, and Hf; 0<x≤1; 0<y≤0.5; x+y≤1; X is at least one selected from the group consisting of F, Cl, Br, and I.

It is preferable that, for the index y in the general formula (II): 0.01≤y≤0.2, more preferably 0.02≤y≤0.075, and most preferably 0.035≤y≤0.55. In an exemplary embodiment, y in the general formula (II) is 0.04, 0.05 and 0.055. Most preferably, in the general formula (II): y=0.05.

In an exemplary embodiment, the index x in the general formula (I) and (II) is as follows: 0<x≤0.80, more preferably 0<x≤0.60, even more preferably 0.01<x≤0.40, especially preferably 0.01≤x≤0.20, more especially preferably 0.01≤x≤0.10, and most preferably 0.02≤x≤0.05.

The compound according to exemplary embodiments may preferably have been coated on its surface with another compound as described further below.

Exemplary embodiments further provide a process for preparing a compound of the general formula (I), including the following steps:

a) preparing a solution/suspension comprising A, N, M and Mn in an AX-containing solution; b) stirring the suspension/solution; and c) removing the solid obtained.

The solution/suspension is prepared in step a) by suspending/dissolving salts containing M, N and Mn in an AX-containing solution. It is possible to add the salts in step a) either successively in any sequence or simultaneously. The salts may be added either as solids or as suspensions or solutions. The AX-containing solution used is an HF-containing solution.

The HF solution used is preferably a concentrated HF solution. Preference is given to using concentrated aqueous HF solution (hydrofluoric acid) with 10-60% by weight of HF, more preferably 20-50% by weight of HF and most preferably 30-40% by weight of HF in the preparation process according to exemplary embodiments.

In the process for preparing a compound of the general formula (I) in step a), salts used as starting compounds for the $A^+$, $M^{6+}$, and $N^{4+}$ ions are preferably Halide or Oxide compounds, for example $A_2MO_4$, AX and $AHX_2$. Preferred $A_2MO_4$ compounds are: $Li_2CrO_4$, $Na_2CrO_4$, $K_2CrO_4$, $Rb_2CrO_4$, $Cs_2CrO_4$, $Li_2MoO_4$, $Na_2MoO_4$, $K_2MoO_4$, $Rb_2MoO_4$, $Cs_2MoO_4$, $Li_2WO_4$, $Na_2WO_4$, $K_2WO_4$, $Rb_2WO_4$, $Cs_2WO_4$, $Li_2ReO_4$, $Na_2ReO_4$, $K_2ReO_4$, $Rb_2ReO_4$ and $Cs_2ReO_4$. $SiO_2$, $GeO_2$, $SnO_2$, $TiO_2$, $PbO_2$, $CeO_2$, $ZrO_2$, $HfO_2$, $H_2SiF_6$, $H_2GeF_6$, $H_2SnF_6$, $H_2TiF_6$, $H_2PbF_6$, $CeF_4$, $ZrF_4$, $HfF_4$, $Li_2SiF_6$, $Li_2GeF_6$, $Li_2SnF_6$, $Li_2TiF_6$, $Li_2PbF_6$, $Li_2ZrF_6$, $Li_2HfF_6$; $Na_2SiF_6$, $Na_2GeF_6$, $Na_2SnF_6$, $Na_2TiF_6$, $Na_2PbF_6$, $Na_2ZrF_6$, $Na_2HfF_6$, $Rb_2SiF_6$, $Rb_2GeF_6$, $Rb_2SnF_6$, $Rb_2TiF_6$, $Rb_2PbF_6$, $Rb_2ZrF_6$, $Rb_2HfF_6$, $Cs_2SiF_6$, $Cs_2GeF_6$, $Cs_2SnF_6$, $Cs_2TiF_6$, $Cs_2PbF_6$, $Cs_2ZrF_6$, $Cs_2HfF_6$. Preferred fluoride compounds AF are: LiF, NaF, KF, RbF, $NH_4F$, CsF. Preferred fluoride compounds $AHF_2$ are: $NaHF_2$, $KHF_2$, $RbHF_2$, $[NH_4]HF_2$ and $CsHF_2$.

Mn is used in step a) preferably in the form of tetravalent manganese salts as starting compounds, for example $A_2MnF_6$. Preferred tetravalent manganese salts $A_2MnF_6$ are $Li_2MnF_6$, $Na_2MnF_6$, $K_2MnF_6$, $Rb_2MnF_6$ and $Cs_2MnF_6$.

The starting compounds can be suspended or dissolved at temperatures between −10 and 100° C., preferably between 0 and 50° C., more preferably between 1° and 40° C. and most preferably between 15 and 30° C.

The suspension/solution is preferably stirred in step b) at temperatures between −10 and 100° C., preferably between 0 and 50° C., more preferably between 1° and 40° C., and most preferably between 15 and 30° C. Preferred periods of time for the stirring of the suspension or solution in step b) are 0.1 to 24 h, 0.5 to 6 h, 1 to 4 h and 2 to 3 h. In an exemplary embodiment, the suspension/solution is stirred in step b) at a temperature between and 30° C. for 2 to 3 h.

The solids obtained are separated in step c) preferably by filtering, centrifuging or decanting, more preferably by filtering through a suction filter.

In an exemplary embodiment, step c) is followed by a further step d), in which the solids obtained in step c) are washed and dried. The solids are preferably washed with an organic solvent until the solids are acid-free. Preference is given to organic solvents, for example, acetone, ethanol, hexane, heptane, octane, dimethylformamide (DMF) and dimethyl sulfoxide (DMSO). The solvent used for washing preferably has a temperature of −10 to 20° C.

The solids are dried in step d) preferably under reduced pressure. The drying can be performed at room temperature (20 to 25° C.) or at an elevated temperature, for example, 25 to 150° C. After the drying in step d), the desired photoluminescent material is obtained.

Exemplary embodiments further provide for the use of the luminescent materials according to exemplary embodiments as luminophore or conversion luminophore, especially for partial or complete conversion of UV light, violet light and/or blue light to lower-energy light, i.e., to light of lower energy in the red region. The compounds according to exemplary embodiments are therefore also referred to as luminophores.

Exemplary embodiments further provide a radiation-converting mixture including a compound according to exemplary embodiments. The radiation-converting mixture may include one or more compounds according to exemplary embodiments and would thus be equivalent to the above-defined term "luminophore" or "conversion luminophore".

It is preferable that the radiation-converting mixture, as well as one compound according to exemplary embodiments, includes one or more further luminescent materials. Preferred luminescent materials are conversion luminophores other than the compounds according to exemplary embodiments, or semiconductor nanoparticles (quantum materials).

In an exemplary embodiment, the radiation-converting mixture includes a compound according to exemplary embodiments and a further conversion luminophore. It is very particularly preferable that the compound according to exemplary embodiments and the further conversion luminophore each emit light with mutually complementary wavelengths.

According to another exemplary embodiment, the radiation-converting mixture includes a compound according to exemplary embodiments and a quantum material. It is very particularly preferable that the compound according to exemplary embodiments and the quantum material each emit light with mutually complementary wavelengths.

According to still another exemplary embodiment, the radiation-converting mixture includes a compound according to exemplary embodiments, a conversion luminophore, and a quantum material.

When the compounds according to exemplary embodiments are used in small amounts, they already yield in good LED qualities. The LED quality is described by customary parameters, for example, the color rendering index (CRI), the correlated color temperature (CCT), lumen equivalents or absolute lumens or the color locus in CIE x and y coordinates.

The color rendering index (CRI) is a unitless lighting technology parameter well known in the art, which compares the trueness of color reproduction of an artificial light source with that of sunlight or filament light sources (the latter two have a CRI of 100).

The correlated color temperature (CCT) is a lighting technology parameter well known in the art with the unit of kelvin. The higher the numerical value, the higher the blue component of the light and the colder the white light from a synthetic radiation source appears to the observer. The CCT follows the concept of the blackbody radiator, the color temperature of which is described by what is called the Planckian locus in the CIE diagram.

The lumen equivalent is a lighting technology parameter well known in the art with the unit lm/W which describes the size of the photometric luminous flux in lumen from a light source at a particular radiometric radiation power with the unit of watts. The higher the lumen equivalent, the more efficient a light source is.

The luminous flux with the unit lumen is a photometric lighting technology parameter well known in the art which describes the luminous flux from a light source, which is a measure of the total visible radiation emitted by a radiation source. The greater the luminous flux, the brighter the light source appears to the observer.

CIE x and CIE y are the coordinates in the CIE standard color diagram well known in the art (1931 Standard Observer), by which the color of a light source is described.

All the parameters listed above can be calculated by methods well known in the art from the emission spectra of the light source.

The excitability of the luminophores according to exemplary embodiments extends over a wide range that extends from about 250 to about 550 nm, preferably from about 325 to about 525 nm.

Exemplary embodiments further provide a light source including at least one primary light source and at least one compound according to exemplary embodiments or a radiation-converting mixture according to exemplary embodiments. The emission maximum of the primary light source here is typically in the range from about 250 to about 550 nm, preferably in the range from about 325 to about 525 nm, with conversion of the primary radiation partly or completely to radiation of longer wavelength by the luminophore according to exemplary embodiments.

In the light source according to an exemplary embodiments, the primary light source includes a luminescent Indium Aluminum Gallium Nitride, especially of the formula $In_iGa_jAl_kN$ where $0 \le i$, $0 \le j$, $0 \le k$, and $i+j+k=1$.

The person skilled in the art is aware of possible forms of light sources of this kind. These may be light-emitting LED chips of different construction.

In the light source according to another exemplary embodiment, the primary light source is a luminescent arrangement based on ZnO, TCO (transparent conducting oxide), ZnSe or SiC, or else an arrangement based on an organic light-emitting layer (OLED).

In the light source according to another exemplary embodiment, the primary light source is a source that exhibits electroluminescence and/or photoluminescence. In addition, the primary light source may also be a plasma source or discharge source.

Corresponding light sources according to exemplary embodiments are also referred to as light-emitting diodes or LEDs.

The luminescent materials according to exemplary embodiments may be used individually or as a mixture with suitable luminescent materials well known in the art. Corresponding luminescent materials that are suitable in principle for mixtures are conversion luminophores or quantum materials.

Conversion luminophores that can be used together with the luminescent material according to exemplary embodiments and form the radiation-converting mixture according to exemplary embodiments are not subject to any particular restriction. It is therefore generally possible to use any possible conversion luminophore. The following are especially suitable: $Ba_2SiO_4:Eu^{2+}$, $Ba_3SiO_5:Eu^{2+}$, $(Ba,Ca)_3SiO_5:Eu^{2+}$, $BaSi_2N_2O_2:Eu$,$BaSi_2O_5:Pb^{2+}$, $Ba_3Si_6O_{12}N_2:Eu$, $Ba_xSr_{1-x}F_2:Eu_2$, $BaSrMgSi_2O_7:Eu^{2+}$, $BaTiP_2O_7$, $(Ba,Ti)_2P_2O_7:Ti$, $BaY_2F_8:Er^{3+}$, $Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+}$,$Mn^{2+}$, $CaAl_2O_4:Tb^{3+}$, $Ca_3Al_2Si_3O_{12}:Ce^{3+}$, $Ca_3Al_2Si_3O_{12}:Ce^{3+}$, $Ca_3Al_2Si_3O_{12}:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+}$, $Mn^{2+}$, $Ca_2Ba_3(PO_4)_3Cl:Eu^{2+}$, $CaBr_2:Eu^{2+}$ in $SiO_2$, $CaCl_2:Eu^{2+}$ in $SiO_2$, $CaCl_2:Eu^{2+}$,$Mn^{2+}$ in $SiO_2$, $CaF_2:Ce^{3+}$, $CaF_2:Ce^{3+}$,$Mn^{2+}$, $CaF_2:Ce^{3+}$,$Tb^{3+}$, $CaF_2:Eu^{2+}$, $CaF_2:Mn^{2+}$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$ in $SiO_2$, $CaI_2:Eu^{2+}$,$Mn^{2+}$ in $SiO_2$, $CaLaBO_4:Eu^{3+}$, $CaLaB_3O_7:Ce^{3+}$,$Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$,$Mn^{2+}$, $Ca_2MgSi_2O_7:Eu^{2+}$,$Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, CaO:TI, $CaO:Zn^{2+}$, $Ca_2P_2O_7:Ce^{3+}$, $\alpha$-$Ca_3(PO_4)_2:Ce^{3+}$, $\beta$-$Ca_3(PO_4)_2:Ce^{3+}$, $Ca_3(PO_4)_3Cl:Eu^{2+}$, $Ca_3(PO_4)_3Cl:Mn^{2+}$, $Ca_3(PO_4)_3Cl:Sb^{3+}$, $Ca_3(PO_4)_3Cl:Sn^{2+}$, $\beta$-$Ca_3(PO_4)_2:Eu^{2+}$,$Mn^{2+}$, $Ca_3(PO_4)_3F:Mn^{2+}$, $Ca_3(PO_4)_3F:Sb^{3+}$, $Ca_3(PO_4)_3F:Sn^{2+}$, $\alpha$-$Ca_3(PO_4)_2:Eu^{2+}$, $\beta$-$Ca_3(PO_4)_2:Eu^{2+}$, $Ca_2P_2O_7:Eu^{2+}$, $Ca_2P_2O_7:Eu^{2+}$,$Mn^{2+}$, $CaP_2O_6:Mn^{2+}$, $\alpha$-$Ca_3(PO_4)_2:Pb^{2+}$, $\alpha$-$Ca_3(PO_4)_2:Sn^{2+}$, $\beta$-$Ca_3(PO_4)_2:Sn^{2+}$, $\beta$-$Ca_2P_2O_7$:Sn,Mn, $\alpha$-$Ca_3(PO_4)_2$:Tr, $CaS:Bi^{3+}$, $CaS:Bi^{3+}$,Na, $CaS:Ce^{3+}$, $CaS:Eu^{2+}$, $CaS:Cu^+$,$Na^+$, $CaS:La^{3+}$, $CaS:Mn^{2+}$, $CaSO_4$:Bi, $CaSO_4:Ce^{3+}$, $CaSO_4:Ce^{3+}$,$Mn^{2+}$, $CaSO_4:Eu^{2+}$, $CaSO_4:Eu^{2+}$,$Mn^{2+}$, $CaSO_4:Pb^{2+}$, $CaS:Pb^{2+}$, $CaS:Pb^{2+}$,CI, $CaS:Pb^{2+}$,$Mn^{2+}$, $CaS:Pr^{3+}$,$Pb^{2+}$,CI, $CaS:Sb^{3+}$, $CaS:Sb^{3+}$,Na, $CaS:Sm^{3+}$, $CaS:Sn^{2+}$, $CaS:Sn^{2+}$,F, $CaS:Tb^{3+}$, $CaS:Tb^{3+}$,Cl, $CaS:Y^{3+}$, $CaS:Yb^{2+}$, $CaS:Yb^{2+}$,Cl, $CaSc_2O_4$:Ce, $Ca_3(Sc,Mg)_2Si_3O_{12}$:Ce, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $Ca_3SiO_5:Eu^{2+}$, $(Ca,Sr)_3SOs:Eu^{2+}$, $(Ca,Sr)_3MgSi_2O_8:Eu^{2+}$, $(Ca,Sr)_3MgSi_2O_8:Eu^{2+}$, $Mn^{2+}$, $CaSiO_3:Mn^{2+}$,Pb, $CaSiO_5:Pb^{2+}$, $CaSiO_3:Pb^{2+}$,$Mn^{2+}$, $CaSiO_5:Ti^{4+}$, $CaSr_2(PO_4)_2:Bi^{3+}$, $\beta$-$(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_3(VO_4)_3Cl$, $CaWO_4$, $CaWO_4:Pb^{2+}$, $CaWO_4$:W, $Ca_3WO_6$:U, $CaYAlO_4:Eu_3$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2$:Sn, (Ce,Mg) $BaAl_{11}O_{18}$:Ce, (Ce,Mg) $SrAl_{11}O_{18}$:Ce, $CeMgAl_{11}O_{19}$:Ce, Tb, $Cd_2B_6O_{11}:Mn^{2+}$, $CdS:Ag^+$,Cr, CdS:In, CdS:In, CdS:In,Te, CdS:Te, $CdWO_4$, CsF, CsI, $CsI:Na^+$, CsI:TI, $(ErCl_3)_{0.25}(BaCl_2)_{0.75}$, GaN:Zn, $Gd_3GasO_{12}:Cr^{3+}$, $Gd_3GasO_{12}$:Cr,Ce, $GdNbO_4:Bi^{3+}$, $Gd_2O_2S:Eu^{3+}$, $Gd_2O_2Pr^{3+}$, $Gd_2O_2S$:Pr,Ce,F, $Gd_2O_2S:Tb^{3+}$, $Gd_2SiO_5:Ce^{3+}$, $KAl_{11}O_{17}$:TI+, $KGa_{11}O_{17}:Mn^{2+}$, $K_2La_2Ti_3O_{10}$:Eu, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $LaCl_3:Ce^{3+}$, $La_2O_3:Bi^{3+}$, $LaOBr:Tb^{3+}$, $LaOBr:Tm^{3+}$, $LaOCH:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+}$, $Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+}$,$Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $LuzSi_2O_7:Ce^{3+}$, $LuTaO_4:Nb^{5+}$, $Lu_{1-x}Y_xAlO_3:Ce^{3+}$, $(Lu,Y)_3(Al,Ga,Sc)_5O_{12}$:Ce, $MgAl_2O_4:Mn^{2+}$, $MgSrAl_{10}O_{17}$:Ce, $MgB_2O_4:Mn^{2+}$, $MgBa_2(PO_4)_2:Sn^{2+}$, $MgBa_2(PO_4)_2$:U, $MgBaP_2O_7:Eu^{2+}$, $MgBaP_2O_7:Eu^{2+}$,$Mn^{2+}$, $MgBa_3Si_2O_8:Eu^{2+}$, $MgBa(SO_4)_2:Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+}$,$Mn_2$, $MgCeAl_{11}O_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+},Mn^{2+}$, $Mg_2Sr(SO_4)_3:Eu^{2+}$, $Mg_2TiO_4:Mn^{4+}$, $MgWO_4$, $MgYBO_4:Eu^{3+}$, $M_2MgSi_2O_7:Eu^{2+}$ (M=Ca, Sr, and/or Ba), $M_2MgSi_2O_7:Eu^{2+},Mn^{2+}$ (M=Ca, Sr, and/or Ba), $M_2MgSi_2O_7:Eu^{2+}$, $Zr^{4+}$ (M=Ca, Sr, and/or Ba), $M_2MgSi_2O_7:Eu^{2+},Mn^{2+},Zr^{4+}$ (M=Ca, Sr, and/or Ba), $Na_3Ce(PO_4)_2:Tb^{3+}$, $Na_{1.23}K_{0.42}Eu_{0.12}TiSi_4O_{11}:Eu^{3+}$, $Na_{1.23}K_{0.42}Eu_{0.12}TiSisO_{13.x}H_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$ (with 0≤x≤2), $NaYF_4:Er^{3+}$, $Yb^{3+}$, $NaYO_2:Eu^{3+}$, $P_{46}$(70%)+$P_{47}$(30%), 6-SiAlON:Eu, $SrAl_{12}O_{19}:Ce^{3+}$, $Mn^{2+}$, $SrAl_2O_4:Eu^{2+}$, $SrA_{14}O_7:Eu^{3+}$, $SrAl_{12}O_{19}:Eu^{2+}$, $SrAl_2S_4:Eu^{2+}$, $Sr_2B_5O,Cl:Eu^{2+}$, $SrB_4O_7:Eu^{2+}$ (F,Cl,Br), $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z}/2:Mn^{2+}$, $Ce^{3+}$, $SrBaSiO_4:Eu^{2+}$, $(Sr,Ba)_3SiO_5:Eu$, $(Sr,Ca)Si_2N_2O_2:Eu$, $Sr(Cl,Br,I)_2:Eu^{2+}$, $SrCl_2:Eu^{2+}$ in $SiO_2$, $SrsCl(PO_4)_3:Eu$, $Sr_wF_xB_4O_{6.5}:Eu^{2+}$, $Sr_wF_xB_yO_z:Eu^{2+},Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $Sr_{2-y}Ba_ySiO_4:Eu$ (where 0≤y≤2), $SrSi_2O_2N_2:Eu$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $Sr_{0.3}B_2O_3:Eu^{2+}$, Cl, β-$Sr_{0.3}B_2O_3:Pb^{2+}$, β-$Sr_{0.3}B_2O_3:Pb^{2+},Mn^{2+}$, α-$Sr_{0.3}B_2O_3:Sm^{2+}$, $Sr_6P_5BO_{20}:Eu,Sr_5(PO_4)_3Cl:Eu^{2+}$, $Sr_5(PO_4)_3Cl:Eu^{2+}$, $Pr^{3+}$, $Sr_5(PO_4)_3Cl:Mn^{2+}$, $Sr_5(PO_4)_3Cl:Sb^{3+}$, $Sr_2P_2O_7:Eu^{2+}$, β-$Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+},Mn^{2+}$, $Sr_5(PO_4)_3F:Sn^{2+}$, $Sr_2P_2O_7:Sn^{2+}$, β-$Sr_3(PO_4)_2:Sn^{2+}$, β-$Sr_3(PO_4)_2:Sn^{2+},Mn^{2+}$ (Al), $SrS:Ce^{3+}$, $SrS:Eu^{2+}$, $SrS:Mn^{2+}$, $SrS:Cu^+,Na$, $SrSO_4:Bi$, $SrSO_4:Ce^{3+}$, $SrSO_4:Eu^{2+}$, $SrSO_4:Eu^{2+}$, $(Sr,Ba)_3SiO_5:Eu^{2+}$, $SrTiO_3:Pr^{3+}$, $SrTiO_3:Pr^{3+},Al^{3+}$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YA_{13}B_4O_{12}:Ce^{3+}$, Mn, $YAl_3B_4O_{12}:Ce^{3+},Tb^{3+}$, Y $Al_3B_4O_{12}:Eu^{3+}$, $YAl_3B_4O_{12}:Eu^{3+}$, $Cr^{3+}$, $YAl_3B_4O_{12}:Th^{4+}$, $Ce^{3+}$, $Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3+}$, $Y_4Al_2O_9:Eu^{3+}$, $Y_3Al_5O_{12}:Mn^{4+}$, $YA_1O_3:Sm^{3+}$, $YA_1O_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+}$, $Yb^{3+}$, $YF_3:Mn^{2+}$, $YF_3:Mn^{2+}$, $Th^{4+}$, $YF_3:Tm^{3+}$, $Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3:(Eu,Pr)$, $Y_2O_3:Bi^{3+}$, $YOBr:Eu^{3+}$, $Y_2O_3:Ce$, $Y_2O_3:Er^{3+}$, $Y_2O_3:Eu^{3+}$, $Y_2O_3:Ce^{3+}$, $Tb^{3+}$, $YOCl:Ce^{3+}$, $YOCl:Eu^{3+}$, $YOF:Eu^+$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+},Th^{4+}$, $YPO_4:V_5$+, $Y(P,V)O_4:Eu$, $Y_2SiO_5:Ce^{3+}$, $YTa_{04}$, $YTa_{04}:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBazS_3:Mn^{2+}$, $(Zn,Be)_2SiO_4:Mn^{2+}$, Zn0.4Cd0.6S:Ag, Zn0.6Cd0.4S:Ag, (Zn,Cd)S:Ag,Cl, (Zn,Cd)S:Cu, ZnF2:Mn2+, ZnGa2O4, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+},Ga^{3+}$, $ZnO:Bi^{3+}$, $ZnO:Ga^{3+}$, ZnO:Ga, ZnO—CdO:Ga, ZnO:S, ZnO:Se, ZnO:Zn, $ZnS:Ag^+,Cl^-$, ZnS:Ag,Cu,Cl, ZnS:Ag,Ni, ZnS:Au,In, ZnS—CdS (25-75), ZnS—CdS (50-50), ZnS—CdS (75-25), ZnS—CdS:Ag,Br,Ni, ZnS—CdS:$Ag^+$,Cl, ZnS—CdS:Cu,Br, ZnS—CdS:Cu,I, ZnS:Cl—, $ZnS:Eu^{2+}$, ZnS:Cu, $ZnS:Cu^+,Al^{3+}$, $ZnS:Cu^+,Cl^-$, ZnS:Cu,Sn, $ZnS:Eu^{2+}$, $ZnS:Mn^{2+}$, ZnS:Mn,Cu, $ZnS:Mn^{2+},Te^{2+}$, ZnS:P, $ZnS:P^{3-},Cl^-$, $ZnS:Pb^{2+}$, ZnS:Pb,Cu, $Zn_3(PO_4)_2:Mn^{2+}$, $Zn_2SiO_4:Mn^{2+}$, $Zn_2SiO_4:Mn^{2+},As^{5+}$, $Zn_2SiO_4:Mn,Sb_2O_2$, $Zn_2SiO_4:Mn^{2+},P$, $Zn_2SiO_4:Ti^{4+}$, $ZnS:Sn^{2+}$, ZnS:Sn,Ag, ZnS:Te,Mn, ZnS—ZnTe:$Mn^{2+}$, $ZnSe:Cu^+$,Cl and $ZnWO_4$.

The compounds according to exemplary embodiments especially show advantages when mixed with further luminophores of other fluorescence colors or when used in LEDs together with such luminophores. Preference is given to using the compounds according to exemplary embodiments together with green-emitting luminophores. It has been found that, especially when the compounds according to exemplary embodiments are combined with green-emitting luminophores, the optimization of lighting parameters for white LEDs is possible particularly successfully.

Corresponding green-emitting luminophores are well known in the art or can be selected from the list above. Particularly suitable green-emitting luminophores here are $(Sr,Ba)_2SiO_4:Eu$, $(Sr,Ba)_3SiO_5:Eu$, $(Sr,Ca)Si_2N_2O_2:Eu$, $BaSi_2N_2O_2:Eu$, $(Lu,Y)_3(Al,Ga,Sc)_5O_{12}:Ce$, SiAlON:Eu, $CaSc_2O_4:Ce$, $CaSc_2O_4:Ce,Mg$, $Ba_3Si_6O_{12}N_2:Eu$ and $Ca_3(Sc,Mg)_2Si_3O_{12}:Ce$. Particular preference is given to $Ba_3Si_6O_{12}N_2:Eu$ and $Ca_3(Sc,Mg)_2Si_3O_{12}:Ce$.

In another exemplary embodiment, it is preferable to use the compound according to exemplary embodiments as the sole luminophore. The compound according to exemplary embodiments shows very good results even when used as a single luminophore.

Quantum materials that can be used together with the luminescent material according to exemplary embodiments and form the radiation-converting mixture according to exemplary embodiments are not subject to any particular restriction. It is therefore generally possible to use any possible quantum material. Suitable quantum materials here are especially semiconductor nanoparticles with elongated, round, elliptical and pyramidal geometry that may be present in a core-shell configuration or in a core-multishell configuration.

The quantum materials preferably consist of semiconductors of groups II-VI, III-V, IV-VI or I-III-VI2 or any combination thereof. For example, the quantum material may be selected from the group consisting of CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AIP, AlSb, CuzS, CuzSe, $CuGaS_2$, $CuGaSe_2$, $CuInS_2$, $CuInSe_2$, $Cu_2(InGa)S_4$, $AgInS_2$, $AgInSe_2$, $Cu_2(ZnSn)S_4$, alloys thereof and mixtures thereof.

Quantum materials may also be present in the form of semiconductor nanoparticles on the surface of unactivated crystalline materials. In materials of this kind, one or more types of semiconductor nanoparticles are present on the surface of one or more kinds of unactivated crystalline materials, for example unactivated luminophore matrix materials.

In yet another exemplary embodiment, it is preferable when the luminophores are disposed on the primary light source, such that the red-emitting luminophore is essentially irradiated by the light from the primary light source, while the green-emitting luminophore is essentially irradiated by the light that has already passed through the red-emitting luminophore or has been scattered thereby. This can be achieved in that the red-emitting luminophore is mounted between the primary light source and the green-emitting luminophore.

The luminophores or luminophore combinations according to exemplary embodiments may be in the form of bulk material, powder material, thick or thin sheet material or self-supporting material, preferably in the form of a film. In addition, it can also be embedded in an encapsulation material.

The luminophores or luminophore combinations according to exemplary embodiments may either be dispersed here in an encapsulation material or, given suitable size ratios, may be disposed directly atop the primary light source or else disposed at a distance therefrom, according to the application (the latter arrangement also includes "remote phosphor technology").

The term "encapsulation material" relates to a transparent matrix material that encapsulates the luminescent materials and radiation-converting mixtures according to exemplary embodiments. The transparent matrix material may be formed from a silicone, a polymer (formed from a liquid or semisolid precursor material, such as a monomer or oligomer), an epoxide, a glass or a hybrid of a silicone and an epoxide. Specific but nonlimiting examples of the polymers include fluorinated polymers, polyacrylamide polymers, polyacrylic acid polymers, polyacrylonitrile polymers, polyaniline polymers, polybenzophenone polymers, poly (methyl methacrylate) polymers, silicone polymers, aluminum polymers, polybisphenol polymers, polybutadiene polymers, polydimethylsiloxane polymers, polyethylene polymers, polyisobutylene polymers, polypropylene polymers, polystyrene polymers, polyvinyl polymers, polyvinyl butyral polymers or perfluorocyclobutyl polymers. Silicones may include gels, for example Dow Corning® OE-6450, elastomers, for example Dow Corning® OE-6520, Dow Corning® OE-6550, Dow Corning® OE-6630, and resins, for example Dow Corning® OE-6635, Dow Corning® OE-6665, Nusil LS-6143 and other products from Nusil, Momentive RTV615, Momentive RTV656 and many other products from other manufacturers. In addition, the encapsulation material may be a polysilazane, for example a modified organic polysilazane (MOPS) or a perhydropolysilazane (PHPS). The proportion of luminescent material or of the radiation-converting mixture, based on the encapsulation material, is preferably in the range from 1% to 300% by weight, more preferably in the range from 3% to 60% by weight.

In a further exemplary embodiment, it is preferable when the optical coupling between the luminescent material and the primary light source is achieved by means of a light-guiding arrangement. It is thus possible to install the primary light source at a central site and to optically couple it to the luminescent material by means of light-guiding devices, for example optical fibers. In this way, it is possible to position an intense primary light: source at a site favorable for electrical installation and, without further electrical cabling, but merely by positioning optical fibers, to install lighting composed of luminescent materials optically coupled to the optical fibers at any desired sites.

Furthermore, the luminophore according to exemplary embodiments or the radiation-converting mixture according to exemplary embodiments may be used in a filament LED as described, for example, in US 2014/0369036 A1.

Exemplary embodiments further provide a lighting unit, especially for backlighting of display devices, characterized in that it includes at least one light source according to exemplary embodiments, and a display device, especially liquid-crystal display device (LC display), having backlighting, characterized in that it includes at least one lighting unit according to exemplary embodiments.

The average particle size of the luminophores according to exemplary embodiments for use in LEDs is typically between 50 nm and 100 μm, preferably between 1 μm and 75 μm and more preferably between 5 μm and 50 μm. The average particle size is preferably ascertained according to ISO 13320:2009 ("Particle size analysis laser diffraction methods"). The ISO standard is based on the measurement of the size distribution of particles by analysis of their light scattering properties.

For use in LEDs, the luminophores can also be converted to any desired external forms, such as spherical particles, films, platelets and structured materials and ceramics. These forms are encompassed in accordance with the invention by the term "shaped bodies". Preferably, the shaped body is a "luminophore body". Exemplary embodiments thus further provide a shaped body including the luminophores according to exemplary embodiments. The production and the use of corresponding shaped bodies are well known in the art from numerous publications.

The compounds according to exemplary embodiments have, surprisingly, the following advantageous properties:

1) The compounds according to exemplary embodiments have an emission spectrum with a high red component of high luminous efficiency and have a high photoluminescent quantum yield.

2) The compounds according to exemplary embodiments lead to a high lumen output of a light emitting device when used as red component for increased LER-values.

3) The compounds according to exemplary embodiments have low thermal quenching. For instance, the TQ1/2 values of the compounds according to exemplary embodiments are typically in the region above 400 K.

4) The high thermal stability of the compounds according to exemplary embodiments enables the use of the material in light sources under high thermal stress as well.

5) The compounds according to exemplary embodiments feature a further processability. Especially the Oxidohalide based host lattice enables easy chemical bondings at the Oxygen functions on the surface of the host lattice to increase stability by e.g., coatings based on e.g., Alumina or Silica or Silanes. These coatings increase the processability in LED manufacturing process. Moreover, the high stability will reduce the possibility of Fluoride-Ion generation by decomposition.

6) The compounds according to exemplary embodiments enable high color rendering and high stability of the color temperature in an LED. This makes it possible to implement warm white LEDs with high color rendering values at low color temperatures e.g., CCT<4000 K.

7) The compounds according to exemplary embodiments can be prepared efficiently and inexpensively via a simple synthesis pathway.

Exemplary embodiments described herein can be combined with one another unless the respective embodiments are mutually exclusive.

The examples which follow are intended to illustrate the exemplary embodiments and, in particular, show the result of illustrative combinations of the exemplary embodiments. However, they should in no way be considered to be limiting; instead, they are supposed to encourage generalization. All compounds or components that are used in the preparation are either known and commercially available or can be synthesized by known methods. The temperatures reported in the examples are always in ° C. It will also be self-evident that, both in the description and the examples, the amounts of the constituents used in the compositions will always add up to a total of 100%. Percentages should always be seen within the given context.

EXAMPLES AND TEST METHODS

The emission spectra were recorded with a fluorescence spectrometer from Edinburgh Instruments Ltd., equipped with mirror optics for powder samples, at an excitation wavelength of 450 nm. The excitation source used was a 450 W Xe lamp. For temperature-dependent measurement of emission, the spectrometer was equipped with a cryostat from Oxford Instruments (MicrostatN2). The coolant used was nitrogen.

Reflection spectra were determined with a fluorescence spectrometer from Edinburgh Instruments Ltd. For this purpose, the samples were positioned in a $BaSO^{4-}$coated Ulbricht sphere and analyzed. Reflection spectra were recorded within a range from 250 to 800 nm. The white standard used was $BaSO_4$ (Alfa Aesar 99.998%). A 450 W high-pressure Xe lamp served as excitation source.

The excitation spectra were recorded with a fluorescence spectrometer from Edinburgh Instruments Ltd., equipped with mirror optics for powder samples, at 550 nm. The excitation source used was a 450 W Xe lamp.

The x-ray diffractograms were recorded with a Rigaku Miniflex II, operated in Bregg-Brentano geometry, in 0.02° steps with an integration time of 1 s with Cu Kalpha radiation.

The crystal structure analysis was conducted as follows: needle-shaped single crystals were isolated. The crystals were stuck to thin quartz fibers with beeswax. The quality of the single crystals for the intensity data collection was verified by Laue images with a Buerger camera (white molybdenum x-radiation, image plate technique, Fujifilm, BAS-1800). The datasets were measured on a diffractometer from Stoe StadiVari, which was equipped with an Mo microfocus source and a Pilatus detection system at 293 K. The temperature was controlled using a Cryostream Plus System (Oxford Cryosystems, 700 series) with an accuracy of ±0.5 K. On the basis of a Gaussian profile of the x-ray source, the scaling was conducted with a numerical absorption correction for all datasets.

Example 1: Preparation of $Na_2Si_{0.85}Mo_{0.08}Mn_{0.07}O_{0.16}F_{5.84}$ 4.28 g (100 mmol) of NaF, 1.45 g (6.00 mmol) of $Na_2MoO_{4x2}H_2O$, 3.6 g (60 mmol) of $SiO_2$, and 1.11 g (4.5 mmol) of $K_2MnF_6$ were each dissolved in 10 ml of hydrofluoric acid (48% by weight). With vigorous stirring, the NaF solution was first combined with the $K_2MnF_6$ solution. Thereafter, the $Na_2MoO_4$ solution and $SiO_2$ solution were slowly added dropwise. There was instantaneous formation of a yellow precipitate. The powder was filtered off and then washed repeatedly with cold Ethanol (about 0° C.). The yellow powder obtained was dried at 100° C. for 8 h.

Example 2: Preparation of $Na_2Si_{0.85}W_{0.08}Mn_{0.07}O_{0.16}F_{5.84}$ 4.28 g (100 mmol) of NaF, 1.63 g (5.50 mmol) of $Na_2WO_4$, 3.0 g (50 mmol) of $SiO_2$, and 1.03 g (4.2 mmol) of $K_2MnF_6$ were each dissolved in 10 ml of hydrofluoric acid (48% by weight). With vigorous stirring, the NaF solution was first combined with the $K_2MnF_6$ solution. Thereafter, the $Na_2WO_4$ solution and $SiO_2$ solution were slowly added dropwise. A yellow precipitate was formed and after filtration and washing with Ethanol a yellow powder with the composition $Na_2Si_{0.9}$ $W_{0.1}O_{0.2}F_{5.8}$ obtained. The yellow powder obtained was dried at 100° C. overnight.

Example 3: Preparation of $K_2Si_{0.87}Mo_{0.09}Mn_{0.04}O_{0.18}F_{5.82}$ 3.11 g (87 mmol) of KF, 1.19 g (5.00 mmol) of $Na_2MoO_{4x2}H_2O$, 3.4 g (57 mmol) of $SiO_2$, and 0.53 g (2.2 mmol) of $K_2MnF_6$ were each dissolved in 7 ml of hydrofluoric acid (48% by weight). While stirring, the KF solution was first combined with the $K_2MnF_6$ solution. Thereafter, the $Na_2MoO_4$ solution and $SiO_2$ solution were slowly added dropwise. A yellow precipitate was formed and after filtration and washing with Ethanol at 0° C., a yellow powder obtained. The yellow powder obtained was dried at 100° C. for 10 hours.

Example 4: Preparation of $K_2Si_{0.65}W_{0.3}Mn_{0.05}O_{0.6}F_{5.4}$ 6.69 g (120 mmol) of KF, 1.63 g (3 mmol) of $K_2WO_4$, 0.27 g (6.5 mmol) of $SiO_2$, and 0.1234 g (0.5 mmol) of $K_2MnF_6$ were each dissolved in 3 ml of hydrofluoric acid (48% by weight). With vigorous stirring, the KF solution was first combined with the $K_2MnF_6$ solution. Thereafter, the $K_2WO_4$ solution and $SiO_2$ solution were slowly added dropwise. There was instantaneous formation of a yellow precipitate that conforms to the composition $K_2Si_{0.65}W_{0.3}Mn_{0.05}O_{0.6}F_{5.4}$. The powder was filtered off and then washed repeatedly with cold acetone (about 0° C.). The yellow powder obtained was dried at 100° C. for 8 h.

Example 5: Preparation of $Na_2Ti_{0.92}W_{0.08}Mn_{0.035}O_{0.16}F_{5.84}$ 8.06 g (100 mmol) of NaAc were dissolved in 18 ml of water. Then 13.8 g (50.00 mmol) of $H_2TiF_6$, 1.3 g (4.5 mmol) of $Na_2WO_4$, and 0.51 g (2.1 mmol) of $K_2MnF_6$ were each dissolved in 15 ml of hydrofluoric acid (48% by weight). With vigorous stirring, the NaAc solution was slowly added dropwise to a solution of the combined $K_2MnF_6$, the $K_2MoO_4$ and $H_2TiF_6$ solutions. There was instantaneous formation of a yellow precipitate. After an additional hour of stirring, the powder was filtered off and then washed repeatedly with cold acetone (0° C.). The yellow powder obtained was dried at 100° C. for 8 h.

Example 6: Preparation of $Na_2Ti_{0.92}Mo_{0.08}Mn_{0.075}O_{0.16}F_{5.84}$ 7.07 g (50 mmol) of $Na_2HPO_4$, 14.4 g (52.70 mmol) of $H_2TiF_6$, 1.42 g (5.9 mmol) of $Na_2MoO_{4x2}H_2O$, and 1.09 g (4.4 mmol) of $K_2MnF_6$ were each dissolved in 15 ml of hydrofluoric acid (48% by weight). With vigorous stirring, the $H_2TiF_6$ solution was slowly added dropwise to a solution of the combined $Na_2HPO_4$, the $K_2MnF_6$ and the $K_2MoO_4$ solutions. There was instantaneous formation of a yellow precipitate. After additional 90 minutes of stirring, the powder was filtered off and then washed repeatedly with cold Ethanol (0° C.). The yellow powder obtained was dried at 100° C. for 8 h.

Figure 6:
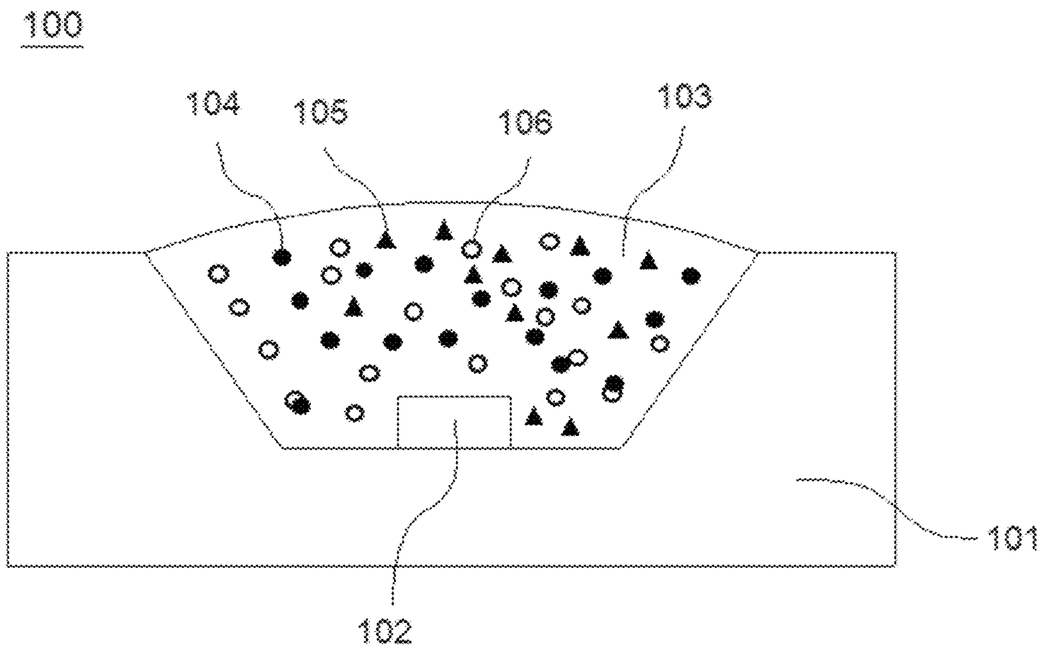
FIG. 6 is a schematic cross-sectional view of a light emitting device according to an exemplary embodiment.

FIG. 6 is a schematic cross-sectional view of a light emitting device 100 according to an exemplary embodiment.

Referring to FIG. 6, the light emitting device 100 includes a housing 101, a light emitting diode 102 and a wavelength conversion unit 103. The wavelength conversion unit 103 may include a plurality of phosphors. In the illustrated exemplary embodiment, the wavelength conversion unit 103 is illustrated as including a first phosphor 104, a second phosphor 105, and a third phosphor 106, but the number of phosphors is not limited thereto.

The housing 101 has an inner wall forming a cavity, and the light emitting diode 102, the first phosphor 104, the second phosphor 105, the third phosphor 106, and the wavelength conversion unit 103 may be disposed in the cavity of the housing 101. The inner wall of the housing 101 may be inclined to reflect light emitted from the light emitting diode 102.

The light emitting diode 102 may be disposed on a bottom surface of the housing 101, and lead terminals electrically connected to the light emitting diode 102 may be disposed in the housing 101. The wavelength conversion unit 103 may include the first, second, and third phosphors 104, 105, and 106 and may cover the light emitting diode 102.

The light emitting diode 102 may be an ultraviolet light emitting diode or a blue light emitting diode. When the light emitting diode 102 is a blue light emitting diode, a peak wavelength of emitted light may be positioned within a range of 410 to 490 nm. A full width at half maximum (FWHM) of a peak wavelength of blue light emitted from the light emitting diode 102 may be 40 nm or less. Although the light emitting device according to the exemplary embodiments is exemplified in a form in which one light emitting diode 102 is disposed, the number and arrangement form of the light emitting diodes 102 are not limited thereto. The wavelength conversion unit 103 may be made of a material having high hardness. Specifically, the wavelength conversion unit may be made of a material including at least one of silicone, epoxy, polymethyl methacrylate (PMMA), polyethylene (PE), and polystyrene (PS) in order to have high hardness.

A plurality of phosphors included in the wavelength conversion unit 103 may be excited by the light emitting diode 102 to emit light in a different wavelength band from that of the light emitting diode 102. Peak wavelengths of light emitted from a plurality of phosphors may be different from each other. The peak wavelengths of light emitted from a plurality of phosphors are different from each other, but some of the peak wavelengths may have the same color gamut. The FWHM of light emitted from the plurality of phosphors may be different from each other. For example, the FWHM of light emitted from the first phosphor may be greater than the FWHM of light emitted from the second phosphor, and the FWHM of light emitted from the second phosphor may be greater than the FWHM of light emitted from the third phosphor.

The first phosphor 104 may be excited by the light emitting diode 102 to emit green light. The second phosphor 105 and the third phosphor 106 may be excited by the light emitting diode to emit red light. Alternatively, the first phosphor 104 and the second phosphor 105 may be excited by the light emitting diode 102 to emit green light, and the third phosphor may be excited by the light emitting diode to emit red light.

The peak wavelength of the green light emitted from the first phosphor 104 may be positioned within a range of 500 to 600 nm. The first phosphor 104 may include at least one selected from a BAM (Ba—Al-Mg)-based phosphor, a quantum dot phosphor, a Silicate-based phosphor, a beta-SiAlON-based phosphor, a Garnet-based phosphor, an LSN-based phosphor, and a fluoride-based phosphor.

The second phosphor 105 may be excited by the light emitting diode 102 to emit red light. The peak wavelength of the red light emitted from the second phosphor 105 may be positioned within a range of 600 to 670 nm. The second phosphor 105 may be nitride-based phosphor represented by CASN, CASON, and SCASN, but is not limited thereto. In addition, the second phosphor 105 may include at least one of the quantum dot phosphor and the sulfide-based phosphor.

The third phosphor 106 may be excited by the light emitting diode 102 to emit red light. The peak wavelength of the red light emitted from the third phosphor 106 may be different from the peak wavelength of the red light emitted from the second phosphor 105. The peak wavelength of the red light emitted from the third phosphor 106 may be positioned within a range of 600 to 670 nm. The third phosphor may be an Mn(IV)-activated phosphor based on an oxidohalide host lattice of Experimental Examples 1 to 6 described above.

Figure 7:
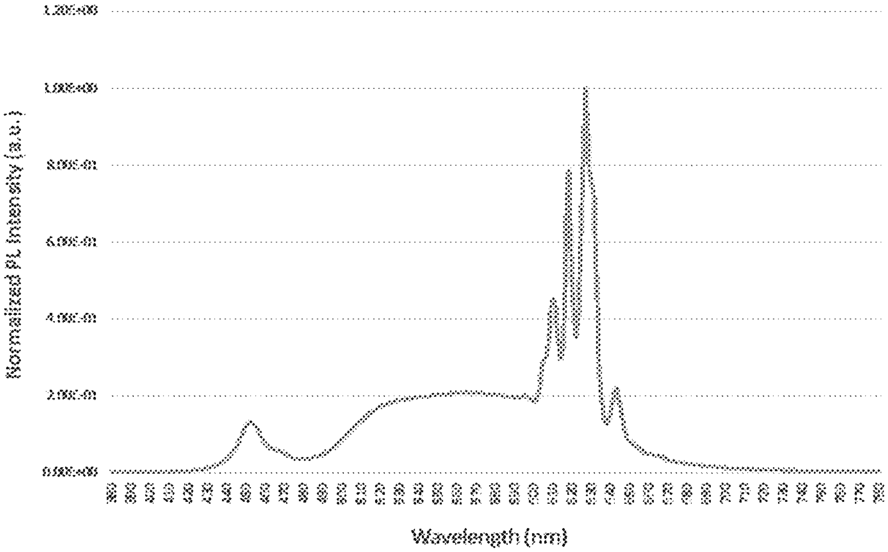
FIG. 7 is a graph schematically showing a spectrum of light emitted from the light emitting device according to an exemplary embodiment.

Referring to FIG. 6, a light emitting device including a blue light emitting diode emitting a peak wavelength of about 450 nm in the housing 101, a Garnet-based green phosphor, a nitride-based red phosphor, and an Mn(IV)-activated red phosphor based on an oxidohalide host lattice is manufactured to measure a color coordinates (CIE), CRI, R9, and Flux (lm (%)), which are shown in Table 1 below, and FIG. 7 illustrates the spectrum of light emitted from the light emitting device.

In addition, for comparison with the light emitting device according to the exemplary embodiments, the light emitting device according to comparative example is manufactured in the same method as the light emitting device according to exemplary embodiments except that the third phosphor includes a nitride-based phosphor different from the second phosphor to measure the color coordinates (CIE), CRI, R9, and Flux (lm (%)), which are shown in Table 1 below.

TABLE 1

| Division | CIE-x | CIE-y | CRI | R9 | lm (%) |
|---|---|---|---|---|---|
| Experimental Example | 0.4688 | 0.417 | 93.9 | 79.4 | 115% |
| Comparative Example | 0.468 | 0.418 | 90 | 50 | 100% |

As shown in Table 1, it can be seen that the light emitting device manufactured according to an exemplary embodiment maintains the desired color coordinates, emits white light with a CRI of 93 or more, and shows a high light amount change rate of 115%. Therefore, the light emitting device manufactured according to the exemplary embodiment has a higher color rendering property than that of the comparative example, and may emit white light having a high amount of light at the same time.

Figure 8:
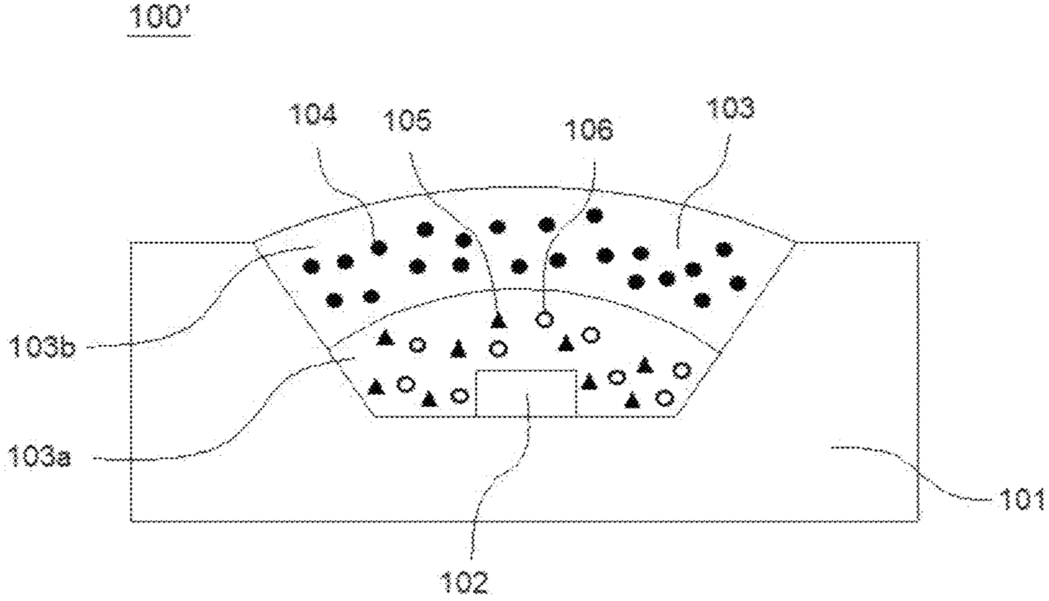
FIG. 8 is a schematic cross-sectional view of a light emitting device according to another exemplary embodiment.

FIG. 8 is a schematic cross-sectional view for describing a light emitting device 100' according to another exemplary embodiment.

Referring to FIG. 8, the light emitting device 100' includes a housing 101, a light emitting diode 102 and a wavelength conversion unit 103, in which the wavelength conversion unit 103 includes a plurality of phosphors 104, 105, and 106. Except for the wavelength conversion unit 103, the light emitting device according to the illustrated exemplary embodiment is generally similar to the light emitting device illustrated with reference to FIG. 6, and therefore, overlapping descriptions of the same components will be omitted.

The wavelength conversion unit 103 may include a first wavelength conversion unit **103*a* and a second wavelength conversion unit 103*b*. The first wavelength conversion unit 103*a* and the second wavelength conversion unit 103*b* may cover the light emitting diode 102, and the second wavelength conversion unit 103*b* may cover the first wavelength conversion unit 103*a*. The first wavelength conversion unit 103*a* may be made of a material having the same hardness as the second wavelength conversion unit 103*b*** or a material having a different hardness.

The first wavelength conversion unit 103_a_ may include phosphors 105 and 106 emitting red light, and the second wavelength conversion unit 103_b_ may contain phosphor 104 emitting green light. The second and third phosphors emitting a long wavelength are disposed on the lower portion, and the first phosphor emitting a shorter wavelength is disposed on the upper portion to prevent green light emitted from the first phosphor from being absorbed by the second phosphor again and being lost.

In addition, the first wavelength conversion unit 103_a_ may include the phosphor 104 emitting green light, and the second wavelength conversion unit may include the phosphor 105 and 106 emitting red light. In this case, at least one of the plurality of phosphors emitting red light may have low efficiency from being excited by green light. As a result, even if the first phosphor emitting green light is disposed on an upper portion, it is possible to prevent loss due to being absorbed by the second phosphor again, whereas it is possible to improve the stability of the red phosphor, which is vulnerable to heat.

Figure 9:
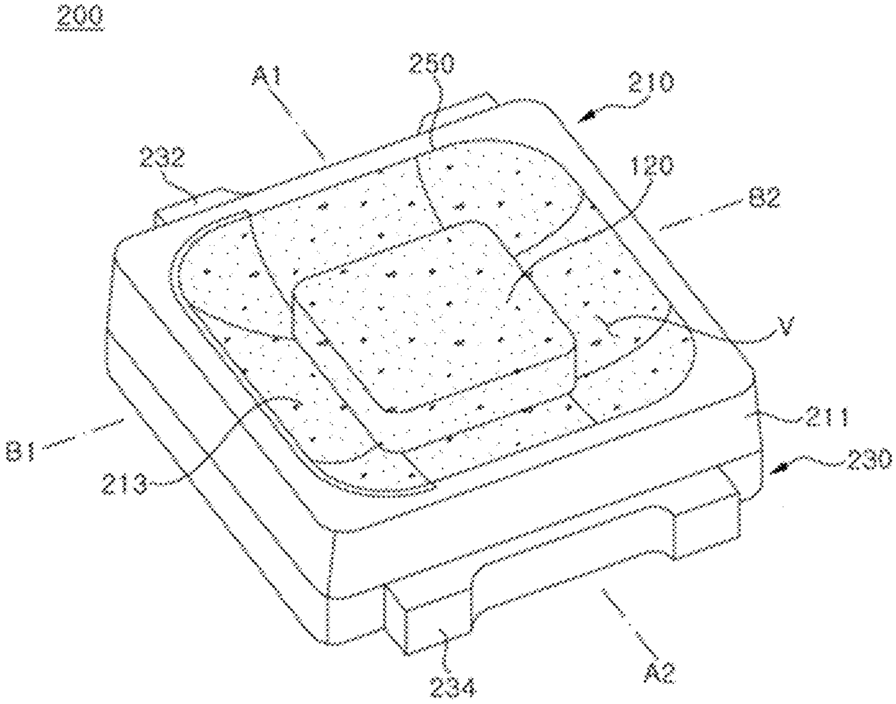
FIGS. 9, 10, and 11 show diagrams of a light emitting device according to another exemplary embodiment.
Figure 10:
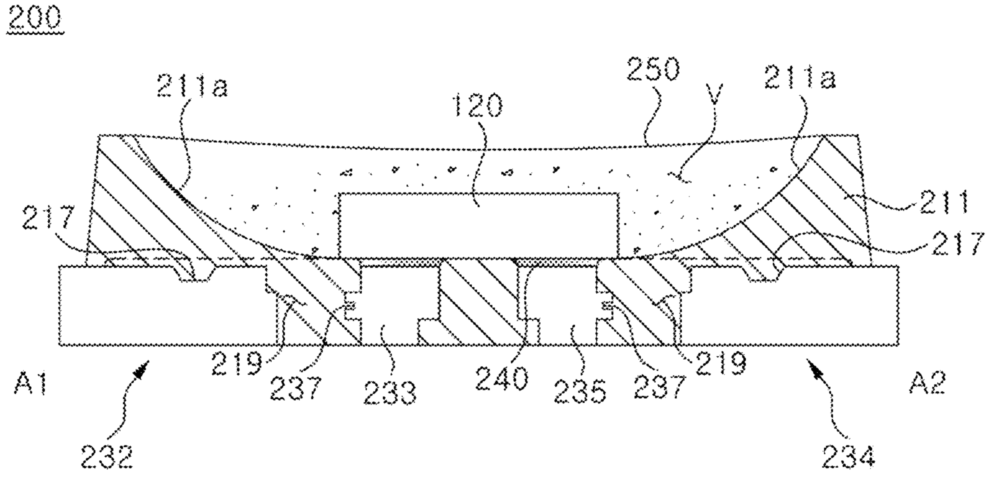
Figure 11:
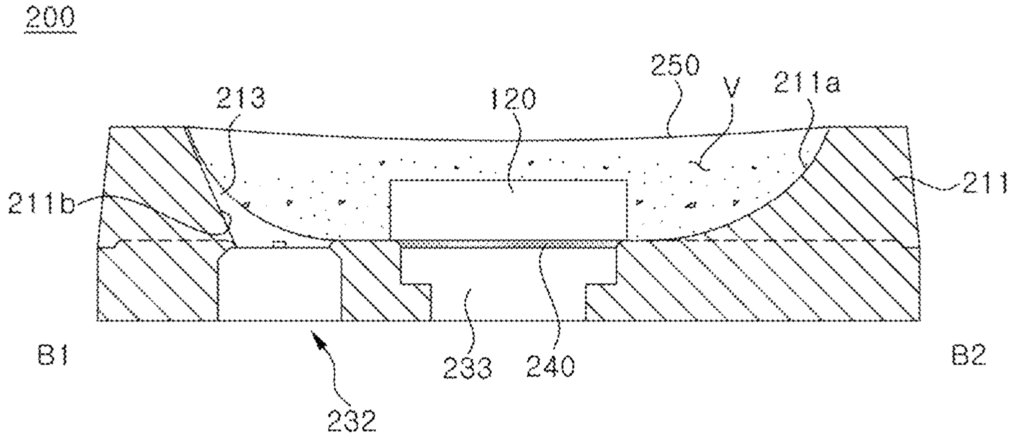

FIGS. 9 to 11 are exemplary diagrams illustrating a light emitting device according to another exemplary embodiment.

Referring to FIG. 9, a light emitting device 200 according to another exemplary embodiment includes a housing 210 and a light emitting diode chip 120. The housing 210 includes a body part 211, a cover part 213, and a molding part 250. In the illustrated exemplary embodiment, the light emitting diode chip 120 is exemplarily illustrated as a single chip, however, the inventive concepts are not limited thereto. For example, in some exemplary embodiments, a structure in which the plurality of light emitting diode chips 120 are disposed in at least one row may be implemented.

As illustrated, the body part 211 may have a substantially rectangular shape on a plane and a shape to surround a lead frame 230 to support the lead frame 230. The housing 210 may have a cavity V having one surface open therein, and the light emitting diode chip 120 may be disposed in a cavity V. Here, a depth of the cavity V may be greater than a height of the light emitting diode chip 120.

The body part 211 may have the same inclined surface as an inclined surface 211_a_ of the cavity V surrounding the light emitting diode chip 120 based on the light emitting diode chip 120. Alternatively, the inclined surfaces of the cavities surrounding the light emitting diode chip 120 may be different. The inclined surface of the cavity V may be the same as an inclined surface 211_b_ of the cover part 213.

The cover part 213 may be formed substantially the same as the cover slope formed in the cavity V, and may be formed using a viscous material containing a reflective material. In this case, the reflective material may be $SiO_2$, $TiO_2$, and $Al_2O_3$.

An adhesive member 240 is interposed in a space between a lower surface of the light emitting diode chip 120 and the lead frame 230. More particularly, the light emitting diode chip 120 is attached to the lead frame 230 by the adhesive member 240. In addition, the adhesive member 240 includes a conductive material that may electrically connect the light emitting diode chip 120 and the lead frame 230. For example, the adhesive member 240 may be made of solder.

The lead frame 230 includes a first lead 232 and a second lead 234.

The first lead 232 includes a first mounting part 233 on which the light emitting diode chip 120 is mounted, and the second lead 234 includes a second mounting part 235 on which the light emitting diode chip 120 is mounted.

Side surfaces of the first mounting part 233 and the second mounting part 235 have a stepped structure.

Referring to FIG. 10, one side surface of the first mounting part 233 and one side surface of the second mounting part 235 are formed so that the upper portion protrudes from the lower portion. Here, one side surface of the first mounting part 233 and one side surface of the second mounting part 235 face each other.

In addition, the other side surface of the first mounting part 233 and the other side surface of the second mounting part 235 are formed so that the central portion protrudes from the upper and lower portions. Here, the other side surface of the first mounting part 233 and the other side surface of the second mounting part 235 are opposite side surfaces of each one side surface.

In addition, concave grooves 237 are formed in protruding portions of the first mounting part 233 and the second mounting part 235.

The protruding part of this structure is inserted into one surface of the body part 211 in contact with the first mounting part 233 and the second mounting part 235. In addition, the groove 237 of the protruding portion is filled with the body part 211.

In this manner, the light emitting device 200 has a structure in which the protruding portions of the first lead 232 and the second lead 234 are inserted into the body part 211, and the body part 211 is inserted into the groove 237 of the protruding portion. That is, the light emitting device 200 has a structure in which the first lead 232 and the second lead 234 and the body part 211 are engaged in a double manner. As such, the first lead 232 and the second lead 234 and the body part 211 may be more firmly coupled to each other. In addition, the structure of the light emitting device 200 as described above increases a penetration path of external foreign matters, thereby preventing internal components of the light emitting device 200 from being damaged due to the penetration of external foreign matters. Here, the external foreign matter may be moisture, dust, etc. present on the outside of the light emitting device 200.

In addition, the side surface of the first lead 232 facing the other side surface of the first mounting part 233 is also formed so that the lower portion more protrudes than the upper portion. In addition, the side surface of the second lead 234 facing the other side of the second mounting part 235 is also formed so that the lower portion more protrudes than the upper portion.

In addition, at least one groove 217 may be formed on the upper surfaces of the first lead 232 and the second lead 234. The groove 217 may be filled with the body part 211.

Referring to FIG. 11, both side surfaces of the first mounting part 233 of the first lead 232 have a structure in which the upper portion protrudes more than the lower portion. FIGS. 10 and 11 are cross-sectional views in different directions. That is, both side surfaces of the first mounting part 233 illustrated in FIG. 10 and both side surfaces of the first mounting part 233 illustrated in FIG. 11 are side surfaces positioned in different directions. Also, although not illustrated in FIG. 11, the second mounting part 235 of the second lead 234 may also have the same structure as the first mounting part 233.

Referring to FIG. 10, a through hole 219 is formed between the first mounting part 233 and an outer surface of the first lead 232. In addition, the second lead 234 also has a through hole 219 formed between the second mounting part 235 and the outer surface. Here, the outer side surface is one surface exposed to the outside from the side surface of the body part 211. The through hole 219 may be formed in various structures. In the illustrated exemplary embodiment, the through hole 219 has an elliptical structure in consideration of the strength (thickness) of the lead frame 230 around the through hole 219, the area of the through hole 219, and the ease of manufacturing the through hole 219. A junction area between the lead frame 230 and the body part 211 increases by a multi-stage structure of the first lead 232 and the second lead 234 and the through hole 219. In addition, the multi-stage structure of the first lead 232 and the second lead 234 increases the penetration path of external foreign matters, thereby preventing damage to the light emitting device 200 due to the penetration of external foreign matters. Accordingly, the reliability of the light emitting device 200 is improved.

The molding part 250 is formed in the cavity V of the body part 211.

The molding part 250 includes a light-transmitting resin and a wavelength conversion material dispersed in the light-transmitting resin. For example, the light-transmitting resin may be an epoxy resin or a silicone resin.

The wavelength conversion material converts the wavelength of light emitted from the light emitting diode chip 120. For example, the wavelength conversion material may be a phosphor. In addition, the wavelength conversion material may contain the Mn(IV)-activated luminescent material based on the oxidohalide host lattice of Experimental Examples 1 to 6 described above. Specifically, in the present exemplary embodiment, the molding part 250 may be a mixture of a red phosphor and a green phosphor in a light-transmitting resin. Alternatively, a yellow phosphor may be further mixed to improve luminescence intensity. The light emitting device 200 may emit white light by mixing light emitted from the light emitting diode chip 120 and light excited by each phosphor. The type of phosphor dispersed in the light-transmitting resin may be variously changed according to the color of light to be emitted from the light emitting device 200. The red phosphor material included in the molding unit 250 may contain the Mn(IV)-activated luminescent material based on the oxidohalide host lattice of Experimental Examples 1 to 6 according to exemplary embodiments.

As illustrated in FIGS. 10 and 11, more wavelength conversion materials may be dispersed in the lower portion of the light-transmitting resin than in the upper portion. More particularly, the concentration of the wavelength conversion material may be higher in the bottom of the cavity V and around the light emitting diode chip 120 than in the upper portion of the light-transmitting resin. In particular, the molding part 250 may have a structure in which the wavelength conversion material is convexly dispersed from the central portion to the upper portion. The molding part 250 filling the cavity V may surround the light emitting diode chip 120 and protect the light emitting diode chip 120 from external materials and external shocks.

Figure 12:
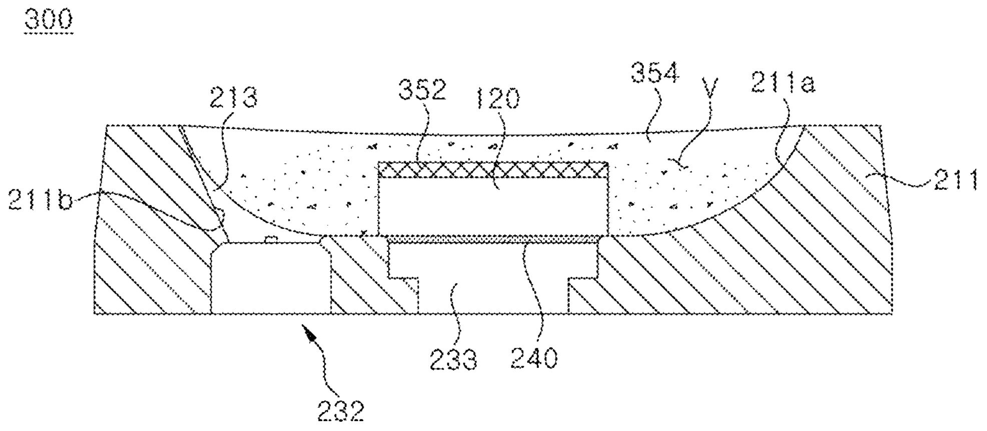
FIG. 12 is a schematic cross-sectional view of a light emitting device according to another exemplary embodiment.

FIG. 12 is a schematic cross-sectional view for describing a light emitting device according to another exemplary embodiment.

Referring to FIG. 12, other components of a light emitting device 300 except for the wavelength conversion member are the same as those of the light emitting device described above. The light emitting device 300 includes a first wavelength conversion member 352 and a second wavelength conversion member 354.

The first wavelength conversion member 352 may be formed to cover an upper surface of the light emitting diode chip 120. For example, the first wavelength conversion member 352 may be the first wavelength conversion material dispersed inside a light-transmitting film. Also, the first wavelength conversion member 352 may be a molding part covering the light emitting diode chip. When the first wavelength conversion member 352 is the molding part, the first wavelength conversion member 352 may be in a molding form covering only an upper surface of the light emitting diode chip or may be in a molding form surrounding an upper surface and a side surface of the light emitting diode chip. In this case, the molding surrounding the side surface of the light emitting diode chip may have a shape extending to the bottom surface of the cavity.

The second wavelength conversion member 354 may be formed to fill the cavity V of the body part 211 to cover the light emitting diode chip 120 and the first wavelength conversion member 352. For example, the second wavelength conversion member 354 may be the second wavelength conversion material dispersed inside a light-transmitting resin. In this case, the second wavelength conversion material may be convexly dispersed in an upward direction in the region in which the light emitting diode chip 120 is positioned.

The first wavelength conversion material and the second wavelength conversion material convert light into different wavelength bands. For example, the first wavelength conversion material may be a red phosphor, and the second wavelength conversion material may be a green phosphor. Alternatively, the first wavelength conversion material may be a green phosphor, and the second wavelength conversion material may be a red phosphor. When the second wavelength conversion material includes a red phosphor, the red phosphor may have an absorption rate of 40% or less of light in a range of 500 nm to 600 nm.

When the first wavelength conversion member includes a green phosphor, the first wavelength conversion member may include a plurality of phosphors. For example, the first wavelength conversion member may include a green phosphor and a red phosphor. In this case, the red phosphor is a wavelength conversion material different from the red phosphor included in the second wavelength conversion member.

Figure 13:
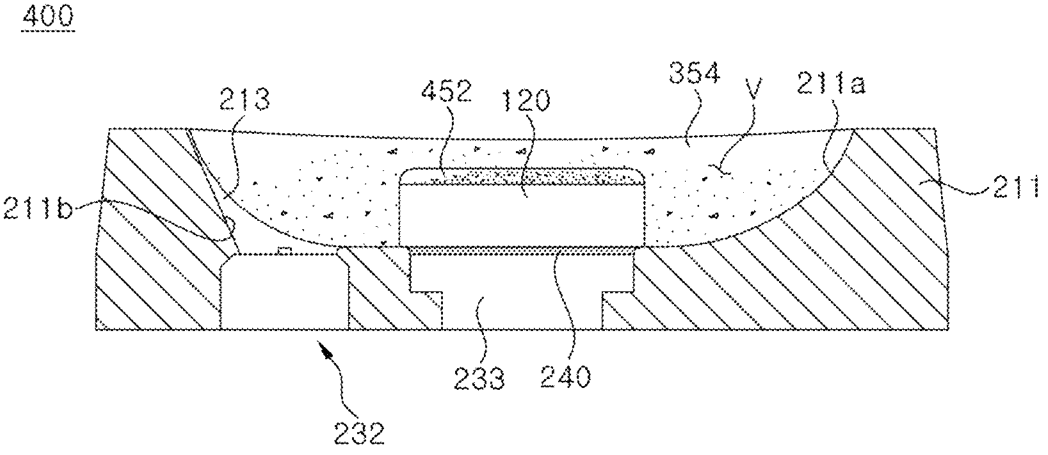
FIG. 13 is a schematic cross-sectional view of a light emitting device according to another exemplary embodiment.

FIG. 13 is a schematic cross-sectional view of a light emitting device according to another exemplary embodiment. The light emitting device 400 according to the illustrated exemplary embodiment is the same as the light emitting diode package according to FIG. 12 except for the wavelength conversion member. Therefore, repeated description of the same elements will be omitted.

Referring to FIG. 13, a light emitting device 400 includes a first wavelength conversion member 452 and a second wavelength conversion member 354. The first wavelength conversion member 452 of the present exemplary embodiment may be formed by applying a wavelength conversion resin on the upper surface of the light emitting diode chip 120 in a dotting method. The wavelength conversion resin may be a light-transmitting resin in which the first wavelength conversion material is dispersed.

When the wavelength conversion material is dotted in the center of the upper surface of the light emitting diode chip 120, the wavelength conversion material spreads along the upper surface of the light emitting diode chip 120. Accordingly, the wavelength conversion material may be more distributed in the central portion of the upper surface of the light emitting diode chip 120 than in the surrounding portion. Accordingly, as illustrated in FIG. 13, the first wavelength conversion member 452 has a structure in which the first wavelength conversion material is convexly dispersed in the center.

Figure 14:
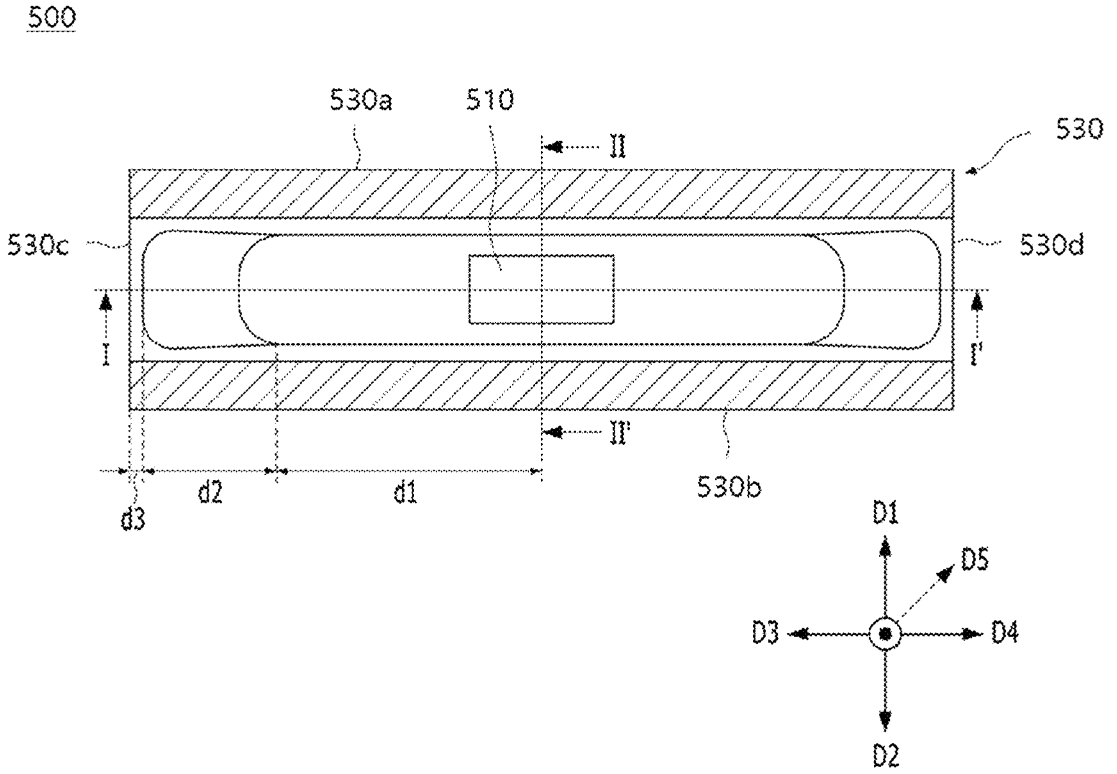
FIGS. 14, 15, and 16 show exemplary diagrams of a light emitting device according to another exemplary embodiment.
Figure 15:
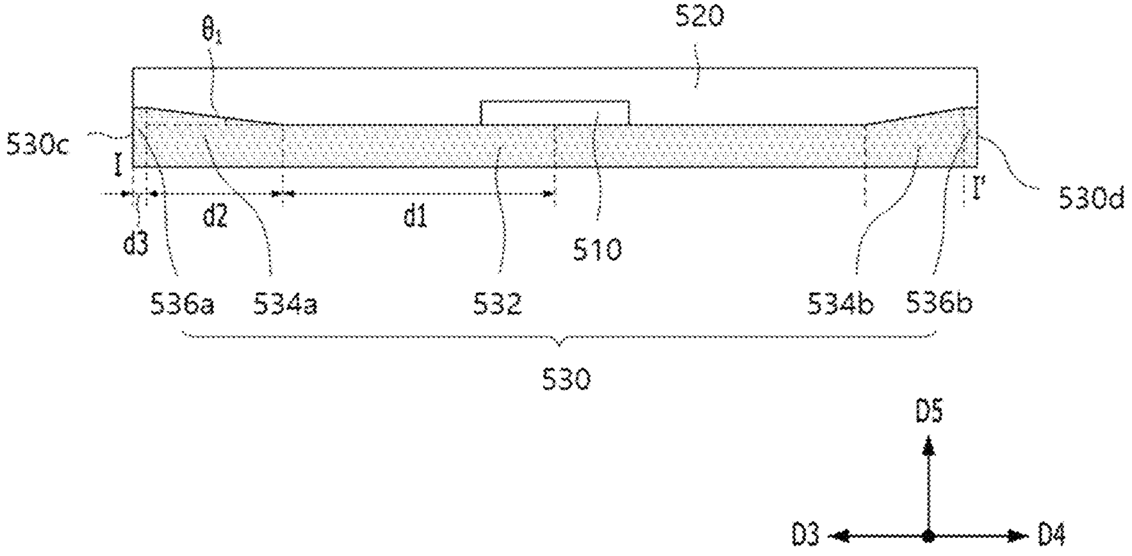

FIG. 14 is a top view of a light emitting device according to another exemplary embodiment. FIG. 15 is a cross-sectional view of a first specific region I-I' of the light emitting device illustrated in FIG. 14, and FIG. 16 is a cross-sectional view of a second specific region II-II' of the light emitting device illustrated in FIG. 14.

Figure 16:
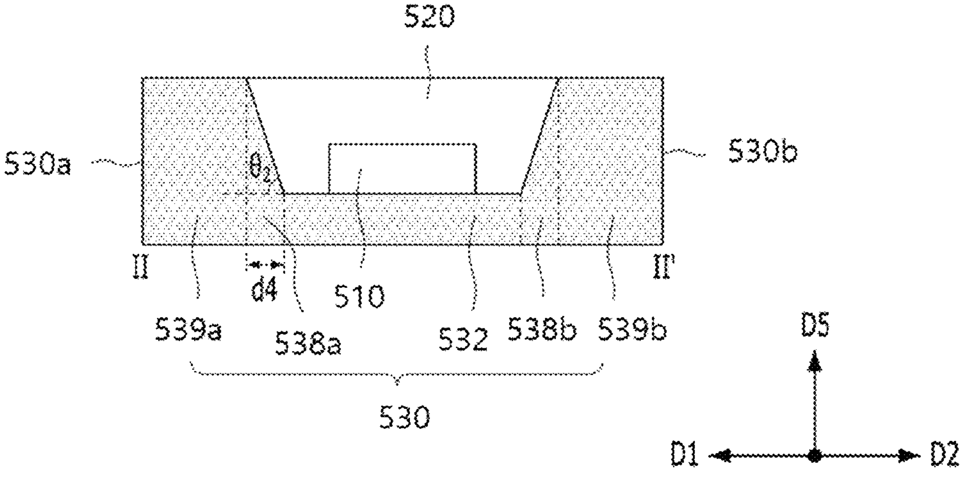

Referring to FIGS. 14 to 16, a light emitting device 500 according to an exemplary embodiment may include a light emitting diode chip 510, a resin part 520 formed on an upper portion of the light emitting diode chip 510, and a housing 530 housing the light emitting diode chip 510. In this case, the housing 530 may function as a reflector that reflects light emitted through the resin part 120. To this end, the housing 530 may be implemented as, for example, white silicone, epoxy, or the like.

In FIG. 14, the light emitting diode chip 510 is exemplarily illustrated as a single chip, but the inventive concepts are not limited thereto. In some exemplary embodiments, the plurality of light emitting diode chips 510 may be disposed in at least one row may be implemented.

The resin part 520 may be formed to cover a light emitting surface of the light emitting diode chip 510. The resin part 520 converts a wavelength of light emitted from the light emitting diode chip 510 to emit white light or light of a specific color. The resin part 520 may be a mixture of a wavelength conversion material, which converts a wavelength of light, with a transparent resin such as silicon or epoxy, glass, ceramic, etc. For example, the transparent resin may be transparent silicone.

The wavelength conversion material may include a phosphor. Examples of a phosphor that emits light in a green wavelength band may include a yttrium aluminum garnet-based phosphor (e.g., $Y_3(Al,Ga)_5O_{12}$:Ce), a lutetium aluminum garnet-based phosphor (e.g., $Lu_3(Al, Ga)_5O_{12}$:Ce), a terbium aluminum garnet-based phosphor (e.g., $Tb_3(Al, Ga)_5O_{12}$:Ce), a silicate-based phosphor (e.g., $(Ba,Sr)_2SiO_4$:Eu), a chlorosilicate-based phosphor (e.g., $Ca_8Mg(SiO_4)_4Cl_2$:Eu), a B sialon-based phosphor (e.g., $Si_{6-z}Al_zO2N_{8-z}$:Eu (0<<<4.2)), an SGS-based phosphor (e.g., $SrGa_2S_4$:Eu), etc. Examples of a phosphor of yellow light may include an a sialon-based phosphor (e.g., $Mz(Si, Al)_{12}(O, N)_{16}$ (however, 0<z≤2, and M is a lanthanide element excluding Li, Mg, Ca, Y, and La and Ce)) and the like.

In addition, there are also phosphors emitting yellow wavelength region among phosphors emitting light in the green wavelength region. For example, the yttrium aluminum garnet-based phosphor may shift an emission peak wavelength toward a longer wavelength by substituting a portion of Y with Gd, thereby emitting light in a yellow wavelength region. In addition, among them, there are also phosphors capable of emitting light in the main yellow wavelength region.

Examples of the phosphors emitting light in a red wavelength region may include nitrogen-containing calcium aluminosilicon (CASN or SCASN)-based phosphor (e.g., (Sr, Ca) $AlSiN_3$:Eu). In addition, there is a manganese-activated fluoride-based phosphor (phosphor represented by general formula (I) A2 $[M_{1-a}Mn_aF_6]$). However, in the general formula (I), A is at least one selected from the group consisting of K, Li, Na, Rb, Cs, and $NH_4$, and M is at least one selected from the group consisting of Group 4 elements and Group 14 elements (a satisfies 0<a<0.2). A representative example of the manganese-activated fluoride-based phosphor may include a manganese-activated potassium silicon fluoride-based phosphor (e.g., $K_2SiF_6$:Mn). Alternatively, there may be the manganese-activated phosphor based on the oxidohalide host lattice (general formula (I) phosphor expressed by $A_2N_{1-x}M_xO_{2x}X_{6-2x}$, general formula (II) $A_2N_{1-x-y}M_xO_{2x}X_{6-2x}:Mn(IV)_y$). However, in the above general formula, A may be selected from the group consisting of Li, Na, K, Rb, Cs, Cu, Ag, Tl, $NH_4$ or two or more mixtures thereof, N may be selected from the group consisting of Si, Ge, Sn, Ti, Pb, Ce, Zr, Ru, Ir, Pr and/or HF or two or more mixtures thereof, M may be selected from the group consisting of W, Cr, Mo, Te and/or Re or two or more mixtures thereof, and X may be selected from the group consisting of F, Cl, Br, I or two or more mixtures thereof, in which 0<x≤1.

Alternatively, it may be the manganese-activated phosphor (general formula (II) $A_2N_{1-x-y}M_xO_{2x}X_{6-2x}:Mn(IV)_y$) based on the oxidohalide host lattice. However, in the above general formula, A may be selected from the group consisting of Li, Na, K, Rb, Cs, Cu, Ag, Tl, $NH_4$ or two or more mixtures thereof, N may be selected from the group consisting of Si, Ge, Sn, Ti, Pb, Ce, Zr, Ru, Ir, Pr and/or HF or two or more mixtures thereof, M may be selected from the group consisting of W, Cr, Mo, Te and/or Re or two or more mixtures thereof, and X may be selected from the group consisting of F, Cl, Br, I or two or more mixtures thereof, in which 0<x≤1, 0<y≤0.5, and x+y<1.

In addition, the housing 530 is formed to surround at least one side surface of the resin part 520 to reflect light emitted from the light emitting diode chip 510. For example, as described above, the housing 530 may be implemented as white silicone, epoxy, or the like. However, the configuration of the housing 530 is not necessarily limited thereto. For example, in some exemplary embodiments, the housing 530 may be made of at least one of silver (Ag) and aluminum (Al) as a material that reflects light and does not transmit even when partially absorbing light. The housing 530 made of silver has high reflectivity of light. In addition, the housing 530 made of aluminum has high adhesion to the resin part 520. In this way, the housing 530 may be formed of a single layer made of silver or aluminum based on reflectivity or adhesion. Alternatively, the housing 530 may have a multi-layered structure in which aluminum, silver, and aluminum are laminated, so that both adhesion and reflectivity may be improved. Although not illustrated in the drawings, at least one of layers made of nickel (Ni) and titanium (Ti) layers may be further disposed on the housing 530. In addition, the material of the housing 530 is not limited to aluminum and silver, and any material capable of reflecting light emitted from the light emitting diode chip 510 may be used in other exemplary embodiments.

Referring to FIGS. 14 to 16, the housing 530 includes a first surface 530*a* in a first direction D1, a second surface 530*b* in a second direction D2 facing the first surface, a third surface 530*c* in a third direction D3 perpendicular to the first direction, and a fourth surface 540*d* in a fourth direction D4 facing the third surface. According to the exemplary embodiment illustrated in FIG. 14, the first surface 530*a* and the second surface 530*b* may be formed longer than the third surface 530*c* and the fourth surface 530*d*, without being limited thereto. That is, the first to fourth surfaces may have the same length. In addition, the light emitting diode chip 510 and the resin part 520 are mounted in an upward direction D5 based on the plane of the housing 530.

FIG. 15 is a cross-sectional view of a first specific region I-I' in the third and fourth directions D3 and D4 of the light emitting device illustrated in FIG. 14, and FIG. 15 illustrates a structure in which the resin part 520 is exposed by cutting the third surface 530*c* and the fourth surface 530*d* of the housing 530. However, the third and fourth surfaces of the housing are not limited thereto, and may have a structure in which the resin part is not exposed.

FIG. 16 is a cross-sectional view of a second specific region II-II' in the first direction D1 and the second direction D2 of the light emitting device illustrated in FIG. 14. As illustrated in FIG. 16, the first surface 530*a* and the second surface 530*b* of the housing 530 have a structure to surround the resin part 520 formed inside the housing 530. More particularly, the resin part 520 is not exposed in the first direction D1 and the second direction D2.

Referring to FIG. 15, the housing 530 may include a mounting part 532 on which the light emitting diode chip 510 is mounted, a third side wall part 534*a* and a fourth side wall part 534*b* extending from the mounting part 532 in the third and fourth directions D3 and D4, a third stepped part 536*a* extending from the third side wall part 534*a* to the third surface 530*c*, and a fourth stepped part 536*b* extending from the fourth side wall part 534*b* to a fourth surface 530*d*.

Also, referring to FIG. 16, the housing 530 may include a mounting part 532 on which the light emitting diode chip 510 is mounted, a first side wall part 538*a* and a second side wall part 538*b* extending from the mounting part 532 in the first and second directions D1 and D2, a first stepped part 539*a* extending from the first side wall part 538*a* to the first side 530*a*, and a second stepped part 539*b* extending from the second side wall part 538*b* to the second surface 530*b*.

A concave region formed by the mounting part 532 and the first to fourth sidewall parts 538*a*, 538*b*, 534*a*, and 534*b* may be defined as a cavity, the light emitting diode chip 510 may be mounted inside the cavity, and the resin part 520 formed on the upper portion of the light emitting diode chip 510 may be formed to fill the inside of the cavity.

The mounting part 532 of the housing 530 is implemented as a flat surface at the center of the cavity as illustrated in FIGS. 15 and 16 to mount the light emitting diode chip 510 thereon.

As illustrated in FIG. 15, the third side wall part 534*a* and the fourth side wall part 534*b* of the housing 530 are implemented as an inclined surface having a first inclination angle θ1 while extending from the mounting part 532 in the third and fourth directions D3 and D4. In addition, as illustrated in FIG. 16, the first side wall part 538*a* and the second side wall part 538*b* of the housing 530 are implemented as an inclined surface having a second inclination angle θ2 while extending from the mounting part 532 in the first and second directions D1 and D2.

As such, the cavity may be formed by the mounting part 532 and the first to fourth side wall parts 534*a*, 534*b*, 538*a*, and 538*b* of the housing 530, such that the resin part 520 formed inside the cavity may be implemented in a form in which an inner surface is recessed to a lower end by the inclined surface of the side wall part. As illustrated, the resin part 520 is implemented in a downward convex form, such that a portion of the light emitted from the light emitting diode chip 510 may be refracted into the resin part 520. In this manner, the light may be emitted more efficiently.

Referring to FIG. 15, a distance from the center of the region in which the light emitting diode chip 510 is mounted to the third side wall part 534*a* is defined as a first distance d1, a distance from the third side wall part 534*a* to the third stepped part 536*a* is defined as a second distance d2, and a distance from the third stepped part 536*a* to the third surface 530*c* of the housing is defined as a third distance d3. In this case, based on the region in which the light emitting diode chip 510 is mounted, the first to third distances d1, d2, and d3 may have a distance relationship of d1>d2>d3. More particularly, by making the first distance d1 sufficiently larger than the other second and third distances d2 and d3, the light emitted from the light emitting diode chip 510 may be maximally guided to the side surface (e.g., the third surface 530*c*) of the housing.

Also, referring to FIG. 16, when the distance from the first side wall part 538*a* to the first stepped part 539*a* is defined as a fourth distance d4, the fourth distance d4 may be smaller than the second distance d2 from the third side wall part 534*a* to the third stepped part 536*a*. As described above, this is because the first inclination angle θ1 of the third side wall part 534*a* and the fourth side wall part 534*b* has a smaller value than the second inclination angle θ2 of the first side wall part 538*a* and the second side wall part 538*b*.

In addition, referring to FIG. 16, the upper surface of the first stepped part 539*a* extending from the first side wall part 538*a* to the first surface 530*a*, and the upper surface of the second stepped part 539*b* extending from the second side wall part 538*b* to the second surface 530*b* may be formed at the same height as the upper surface of the resin part 520. Accordingly, when the light emitted from the light emitting diode chip 510 is re-incident and reaches the outer periphery of the housing 530, it is possible to increase light emission efficiency by reducing the re-incidence into the cavity.

Figure 17:
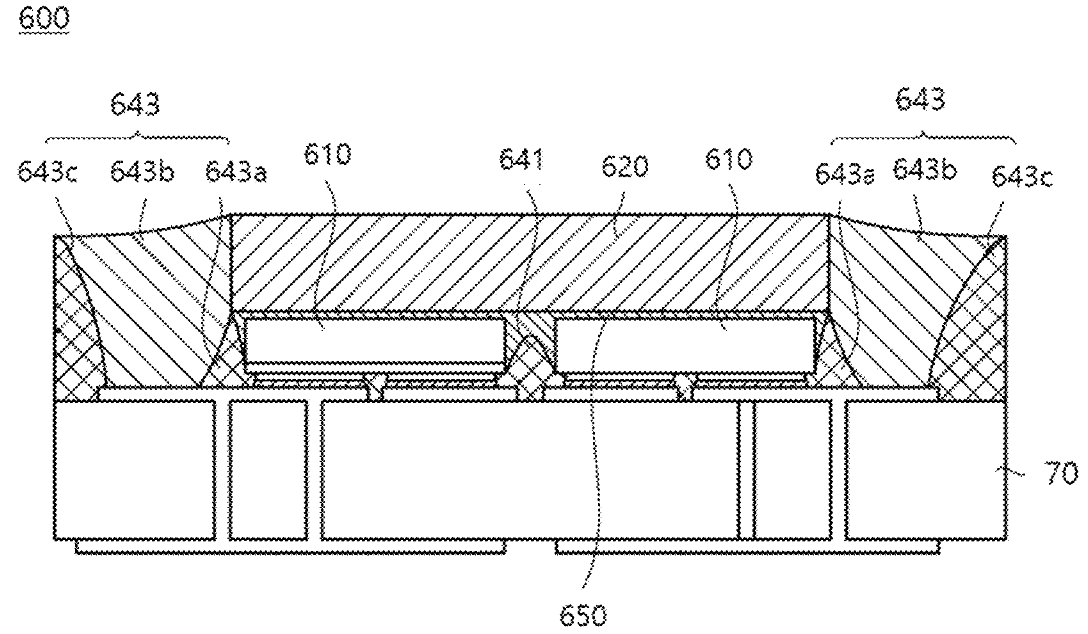
FIG. 17 is a schematic cross-sectional view of a light emitting device according to another exemplary embodiment.

FIG. 17 is a schematic cross-sectional view of a light emitting device according to another exemplary embodiment.

Referring to FIG. 17, a light emitting device 600 may include a substrate 70 and a plurality of light emitting diode chips 610 disposed on the substrate 70. The light emitting device 600 may include a light emitting diode chip 610 and a light transmitting layer 620 positioned on an upper surface of the light emitting diode chip 610, respectively, and an inner wall part 641 positioned between the light emitting diode chips 610 and a side wall part including an outer wall part 643 surrounding the light emitting diode chip 610.

The outer wall part 643 may include a plurality of outer wall parts 643*a*, 643*b*, and 643*c*. The first outer wall part 643*a* surrounds outer side surfaces of the light emitting diode chips 610. An upper end of the first outer wall part 643*a* may contact the light transmitting layer 620. As illustrated, the upper end of the first outer wall part 643*a* may be positioned higher than the upper surface of the light emitting diode chip 610 and may be positioned below ½ of the thickness of the light transmitting layer 620. The upper end of the first outer wall part 643*a* may be positioned at the same height as the upper surface of the light-transmitting adhesive layer 650, that is, the lower surface of the light transmitting layer 620.

The second outer wall part 643*b* surrounds the first outer wall part 643*a* and furthermore, surrounds outer side surfaces of the light transmitting layers 620. The second outer wall part 643*b* may contact side surfaces of the light transmitting layers 620. The second outer wall part 643*b* may have a greater width than the first and third outer wall parts 643*a* and 643*c*. A bottom surface of the second outer wall part 643*b* may come into contact with the substrate 700, an inner side surface of the second outer wall part 643*b* may come into contact with the first outer wall part 643*a* and the light transmitting layer 620, and an outer side surface of the second outer wall part 643*b* may come into contact with the third outer wall part 643*c*. The upper surface of the second outer wall part 643*b* may extend from the upper surface of the third outer wall part 643*c* and the upper surface of the light transmitting layer 620, and an upper surface of the second outer wall part 643*b* may have a curved shape in at least a partial area. The upper surface and bottom surface of the second outer wall part 643*b* may have different widths.

In addition, an area defined between the second outer wall parts 643*b* may have a width greater than that of the bottom surface of the light transmitting layer 620, and the width of the area in contact with the bottom surface of the light transmitting layer 620 may be smaller than the width of the upper surface thereof. The width of the bottom surface of the second outer wall part 643*b* may be equal to or less than ½ of the width of the upper surface. The third outer wall part 643*c* surrounds the second outer wall part 643*b*. The third outer wall part 643*c* forms an outer side wall of the light emitting device 600. The third outer wall part 643*c* may have a shape, in which the width increases as it approaches the substrate 70. The inner side surface of the third outer wall part 643*c* may be formed as a curved surface, and the outer side surface thereof may be formed as a plane parallel to the side surface of the substrate 70. The outer side surface of the third outer wall part 643*c* may be parallel to the side surface of the substrate 70. In an exemplary embodiment, the bottom surface of the third outer wall part 643*c* may be in contact with the substrate 70, and the lower end of the inner side surface may have an inclination angle of 70° or more and less than 100° with respect to the substrate 70, and may specifically have an inclination angle of 80° or more and less than 90°.

The first to third outer wall parts 643*a*, 643*b*, and 643*c* may be formed of silicone resin, epoxy resin, or acrylic resin, and may be formed by including one or more of the resin and a reflective material. The reflective material may include $TiO_2$, $SiO_2$, $ZrO_2$, $F_6K_2Ti$, $Al_2O_3$, AlN, BN, and the like.

Meanwhile, the second outer wall part 643*b* may be made of a material different from that of the first and third outer wall parts 643*a* and 643*c*. For example, the first outer wall part 643*a* and the third outer wall part 643*c* may be made of the same type of resin including a reflective material, and the second outer wall part 643*b* may be made of the same or different type of resin as or from the first and third outer wall parts 643*a* and 643*c* and may additionally include a material to prevent cracking, for example, calcium. Also, the width of the second outer wall part 643*b* may be controlled to reduce light loss. For example, the maximum width of the second outer wall part 643*b* may be 1500 μm or less, and specifically, the maximum width may be 300 μm to 1000 μm. When the maximum width of the second outer wall part 643*b* is 600 μm to 1000 μm, cracks may be effectively prevented and light loss may be reduced.

The inner wall part 641 may be made of the same material as the first outer wall part 643*a*, but is not limited thereto, and may be made of the same material as the second outer wall part 643*b* in other exemplary embodiments.

The light-transmitting adhesive layer 650 may include a region disposed between the light emitting diode chip 610 and the light transmitting layer 620 and a region surrounding a side surface of the light emitting diode chip 610. The region of the light-transmitting adhesive layer 650 surrounding the side surface of the light emitting diode chip 610 may contact the inner wall part 641 and the first outer wall part 643*a*. A thickness of the light-transmitting adhesive layer 650 disposed on the upper surface of the light emitting diode chip 610 may be different from a thickness of a region surrounding the side surface of the light emitting diode chip 610. For example, the light-transmitting adhesive layer 650 disposed on the upper surface of the light emitting diode chip 610 may have a thickness of 2 μm or more and 10 μm or less. Meanwhile, the light-transmitting adhesive layer 650 formed on the side surface of the light-emitting diode chip 610 may have a smaller width as it approaches the substrate 70. The light-transmitting adhesive layer 650 may cover a portion of the side surface of the light emitting diode chip 610 or may cover the entire side surface.

In the illustrated exemplary embodiment, the outer wall part 643 may have different widths according to positions. The right outer wall part 643 may have a larger width than the left outer wall part 643. In particular, the width of the third outer wall part 643*c* may be different according to the positions. However, the difference in the width of the outer wall part 643 according to positions is controlled so as not to affect the light profile, and may be, for example, 100 μm or less, or 50 μm or less.

The light transmitting layer 620 may transmit light emitted from the light emitting diode chip 610 and, if necessary, convert a wavelength of light emitted from the light emitting diode chip 610 so that light of a specific color is emitted. In addition, the light transmitting layers 620 may emit light of different colors, respectively.

The light transmitting layer 620 may be a transparent resin such as silicon or epoxy, glass, ceramic, or the like, and, if necessary, a wavelength conversion material that converts a wavelength of light may be mixed with these materials. For example, the transparent resin may be transparent silicone. The wavelength conversion material may include at least one of a quantum dot phosphor and an inorganic or organic phosphor, and a yellow phosphor, a red phosphor, and a green phosphor may be used.

Examples of the yellow phosphor include a YAG:Ce ($T_3Al_3O_{12}$:Ce)-based phosphor which is a yttrium (Y) aluminum (Al) garnet doped with cerium (Ce) having a wavelength of 530 to 570 nm as a main wavelength, or a silicate-based phosphor.

Examples of the red phosphor include a UOX ($Y_2O_3$: EU)-based phosphor, consisting of a compound of yttrium oxide ($Y_2O_3$) and europium (EU) having a wavelength of 600 to 700 nm as a main wavelength, a nitride phosphor, or a fluoride-based phosphor. In this case, it may be more preferable to include a fluoride compound KSF phosphor ($K_2SiF_6$), which is a $Mn^{4+}$ activator phosphor that is advantageous for high color reproduction. Alternatively, the red phosphor may be the Mn(IV)-activated phosphor based on the oxidohalide host lattice. The Mn(IV)-activated phosphor based on the oxidohalide host lattice may have an emission maximum value in the range between 610 nm and 640 nm, high quantum yields, high color rendering properties, and stability and may be expressed by following general formula (I or II).

$$A_2N_{1-x}M_xO_{2x}X_{6-2x} \quad \text{(I)}$$

Here, A may be selected from the group consisting of Li, Na, K, Rb, Cs, Cu, Ag, Tl, $NH_4$ or two or more mixtures thereof, N may be selected from the group consisting of Si, Ge, Sn, Ti, Pb, Ce, Zr, Ru, Ir, Pr and/or HF or two or more mixtures thereof, M may be selected from the group consisting of W, Cr, Mo, Te and/or Re or two or more mixtures thereof, and X may be selected from the group consisting of F, Cl, Br, I or two or more mixtures thereof, in which $0<x\leq1$.

$$A_2N_{1-x-y}M_xO_{2x}X_{6-2x}:Mn(IV)_y \quad \text{(II)}$$

Here, A may be selected from the group consisting of Li, Na, K, Rb, Cs, Cu, Ag, Tl, $NH_4$ or two or more mixtures thereof, N may be selected from the group consisting of Si, Ge, Sn, Ti, Pb, Ce, Zr, Ru, Ir, Pr and/or HF or two or more mixtures thereof, M may be selected from the group consisting of W, Cr, Mo, Te and/or Re or two or more mixtures thereof, and X may be selected from the group consisting of F, Cl, Br, I or two or more mixtures thereof, in which $0<x\leq 1$, $0<y\leq 0.5$, and $x+y<1$.

Examples of the green phosphor include an SiAlON-based phosphor or a LAP ($LaPO_4$:Ce, Tb)-based phosphor consisting of a compound of phosphoric acid ($PO_4$), lanthanum (La), and terbium (Tb) having a wavelength of 500 to 590 nm as the main wavelength.

Examples of the blue phosphor may be a BAM ($BaMgAl_{10}O_{17}$:EU)-based phosphor consisting of a compound of barium (Ba), magnesium (Mg), aluminum oxide-based materials, and europium (EU) having a wavelength of 420 to 480 nm as a main wavelength.

The light transmitting layer 620 may have an upper surface and a lower surface having the same width, and the upper surface and the lower surface may be perpendicular to a side surface of the light transmitting layer 120. The width of the light transmitting layer 620 may be greater than that of the light emitting diode chip 610 and may be disposed to cover the upper surface of the light emitting diode chip 610. Accordingly, an area where light is emitted from the light transmitting layer 620 may be formed to be relatively wider than that of the light emitting diode chip 610. The light transmitting layer 620 may have a rectangular shape, but is not limited thereto.

Figure 18:
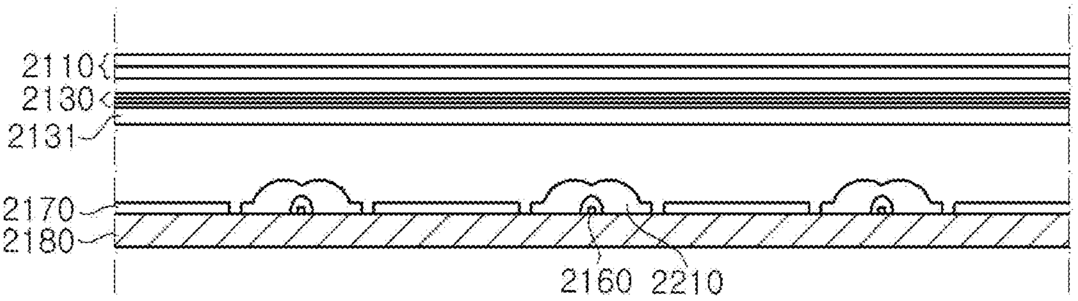
FIG. 18 is a schematic cross-sectional view of a display device to which the light emitting device according to exemplary embodiments is applied.

FIG. 18 is a schematic cross-sectional view of a display device to which the light emitting device according to the exemplary embodiments is applied.

The display device according to the illustrated exemplary embodiment includes a display panel 2110, a backlight unit providing light to the display panel 2110, and a panel guide supporting an edge of a lower portion of the display panel 2110.

The display panel 2110 is not particularly limited, and may be, for example, a liquid crystal display panel including a liquid crystal layer. A gate driving PCB for supplying a driving signal to the gate line may be further positioned at an edge of the display panel 2110. Here, the gate driving PCB may not be formed on a separate PCB, but may be formed on a thin film transistor substrate, without being limited thereto.

The backlight unit includes a light source module including at least one substrate and a plurality of light emitting devices 2160. Furthermore, the backlight unit may further include a base substrate 2180, a reflective unit 2170, a diffusion plate 2131, and optical sheets 2130.

The base substrate 2180 is open to an upper portion, and may have a substrate, a light emitting device 2160, a reflective sheet 2170, a diffusion plate 2131, and optical sheets 2130 accommodated therein. In addition, the base substrate 2180 may be coupled with the panel guide. The base substrate 2180 may be positioned on a lower portion of the reflective unit 2170, and the light emitting device 2160 may be surrounded by the reflective unit 2170. However, the inventive concepts are not limited thereto, and when a reflective material is coated on the surface of the base substrate 2180, the light emitting device 2160 may be positioned on the reflective unit 2170. In addition, a plurality of substrates may be formed, and a plurality of substrates may be disposed side by side, but the substrate is not limited thereto and a single substrate may be used.

The light emitting devices 2160 may be regularly disposed in a predetermined pattern on the substrate. The light emitting devices 2160 may be disposed in a square shape or, in another form, may be alternately disposed so as not to overlap adjacent light emitting devices 2160.

In addition, a light guide 2210 may be disposed on each light emitting device 2160 to improve uniformity of light emitted from the plurality of light emitting devices 2160. The light guide 2210 may be one of materials, such as Si, a lens, and a phosphor-containing resin. The light guide 2210 may have an upper surface parallel to the base substrate 2180, or may have a convex curved surface.

The diffusion plate 2131 and optical sheets 2130 are positioned on the light emitting device 2160. Light emitted from the light emitting device 2160 may pass through the diffusion plate 2131 and the optical sheets 2130 and be supplied to the display panel 2110 in the form of a surface light source.

In this way, the light emitting device according to the exemplary embodiments may be applied to a direct type display device.

Figure 19:
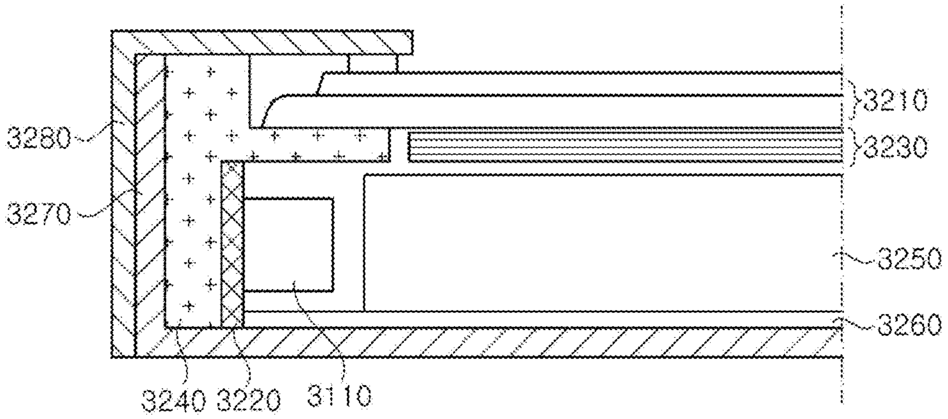
FIG. 19 is a schematic cross-sectional view of a display device to which the light emitting device according to another exemplary embodiment is applied.

FIG. 19 is a schematic cross-sectional view of a display device to which a light emitting diode according to another exemplary embodiment is applied.

A display device equipped with a backlight unit according to the exemplary embodiment includes a display panel 3210 on which an image is displayed and a backlight unit that is disposed on the rear surface of the display panel 3210 to irradiate light. Furthermore, the display device includes a frame supporting the display panel 3210 and accommodating the backlight unit, and covers 3240 and 3280 surrounding the display panel 3210.

The display panel 3210 is not particularly limited, and may be, for example, a liquid crystal display panel including a liquid crystal layer. A gate driving PCB for supplying a driving signal to the gate line may be further positioned at an edge of the display panel 3210. Here, the gate driving PCB may not be formed on a separate PCB, but may be formed on a thin film transistor substrate. The display panel 3210 is fixed by the covers 3240 and 3280 positioned on the upper and lower portions thereof, and the cover 3240 positioned on the lower portion may be coupled to the backlight unit.

The backlight unit providing light to the display panel 3210 includes a lower portion cover 3270 in which a portion of the upper surface is opened, a light source module disposed on one inner side of the lower portion cover 3270, and a light guide plate 3250 positioned in parallel with the light source module to convert point light into surface light. In addition, the backlight unit of the illustrated exemplary embodiment may further include optical sheets 3230 positioned on the light guide plate 3250 to diffuse and condense light, and a reflective sheet 3260 disposed on the lower portion of the light guide plate 3250 to reflect light traveling in the direction of the lower portion of the light guide plate 3250 toward the display panel 3210.

The light source module includes a substrate 3220 and a plurality of light emitting devices 3110 disposed apart from each other at regular intervals on one surface of the substrate 3220. The substrate 3220 is not limited as long as it supports the light emitting device 3110 and is electrically connected to the light emitting device 3110, and may be, for example, a printed circuit board. The light emitting device 3110 may include at least one light emitting diode according to the above-described exemplary embodiments. Light emitted from the light source module is incident on the light guide plate 3250 and supplied to the display panel 3210 through the optical sheets 3230. Point light sources emitted from the light emitting devices 3110 may be transformed into surface light sources through the light guide plate 3250 and the optical sheets 3230.

In this way, the light emitting device according to the exemplary embodiments may be applied to an edge type display device.

Figure 20:
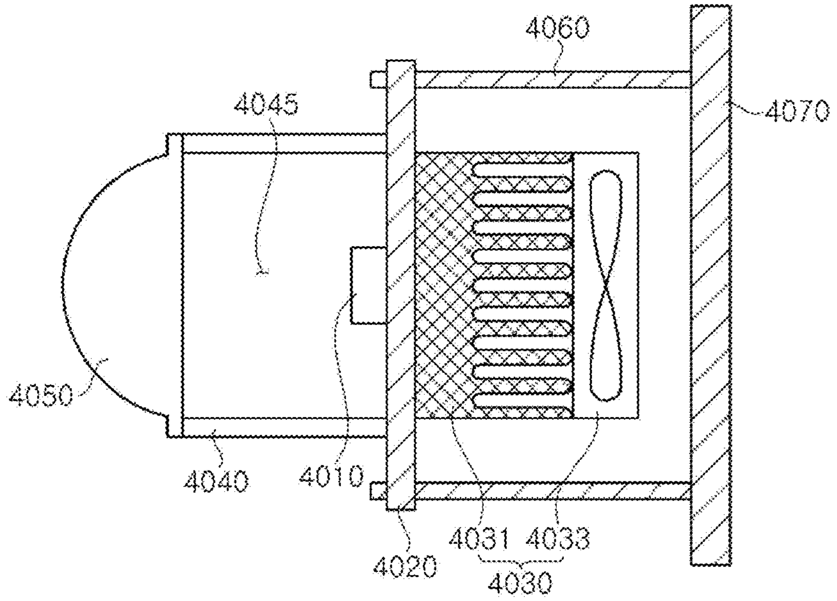
FIG. 20 is a schematic cross-sectional view of a display device to which the light emitting device according to another exemplary embodiment is applied.

FIG. 20 is a schematic cross-sectional view of a headlamp in which a light emitting diode according to another exemplary embodiment is applied.

Referring to FIG. 20, the headlamp includes a lamp body 4070, a substrate 4020, a light emitting device 4010, and a cover lens 4050. Furthermore, the headlamp may further include a heat dissipation unit 4030, a support rack 4060, and a connection member 4040.

The substrate 4020 is fixed by the support rack 4060 and disposed over apart from each other on the lamp body 4070. The substrate 4020 is not limited as long as it may support the light emitting device 4010, and may be, for example, a substrate having a conductive pattern, such as a printed circuit board. The light emitting device 4010 is positioned on the substrate 4020 and may be supported and fixed by the substrate 4020. In addition, the light emitting device 4010 may be electrically connected to an external power supply through a conductive pattern of the substrate 4020. In addition, the light emitting device 4010 may include at least one light emitting diode according to the above-described embodiments.

The cover lens 4050 is positioned on a light path of the light emitting device 4010. For example, as illustrated, the cover lens 4050 may be spaced apart from the light emitting device 4010 by the connection member 4040, and may be disposed in a direction in which light emitted from the light emitting device 4010 is to be provided. A beam opening angle and/or color of light emitted from the headlamp to the outside may be adjusted by the cover lens 4050. Meanwhile, the connection member 4040 may fix the cover lens 4050 to the substrate 4020, and may be disposed to surround the light emitting device 4010 to function as a light guide to provide a light emitting path 4045. In this case, the connection member 4040 may be made of a light reflective material or coated with the light reflective material. Meanwhile, the heat dissipation unit 4030 may include a heat dissipation fin 4031 and/or a heat dissipation fan 4033, and emits heat generated when the light emitting device 4010 is driven to the outside.

Figure 21:
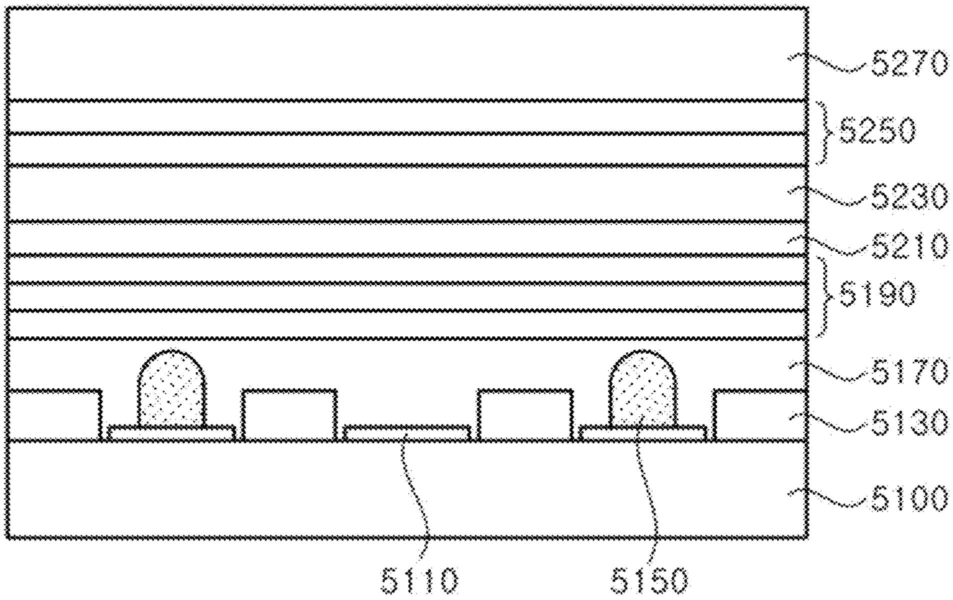
FIG. 21 is a schematic cross-sectional view of a display device to which the light emitting device according to another exemplary embodiment is applied.

FIG. 21 is a schematic cross-sectional view of a display device to which a light emitting device according to another exemplary embodiment is applied.

The display device according to the illustrated exemplary embodiment includes a display panel 5270 and a backlight unit providing light to the display panel 5270.

The display panel 5270 is not particularly limited, and may be, for example, a liquid crystal display panel including a liquid crystal layer. A gate driving PCB for supplying a driving signal to the gate line may be further positioned at an edge of the display panel 5270. Here, the gate driving PCB may not be formed on a separate PCB, but may be formed on a thin film transistor substrate.

The backlight unit may include a circuit board 5100, a reflective unit 5110, a light emitting device 5130, a dam part 5150, and a molding part 5170.

The backlight unit includes a light source module including the circuit board 5100 and the plurality of light emitting devices 5130 disposed on the circuit board 5100. One light source module may be used as the backlight unit, or a plurality of light source modules may be aligned on a plane and used as the backlight unit.

The reflective unit 5110 may be disposed on a surface of the circuit board 5100. The reflective unit 5110 may be provided as a reflective sheet or coated on the circuit board 5100. The reflective unit 5110 may surround the light emitting devices 5130 by being formed around a region in which the light emitting devices 5130 are mounted. However, the inventive concepts are not limited thereto, and the light emitting devices 5130 may be disposed on the reflective unit 5110.

The circuit board 5100 has circuits for supplying power to the light emitting devices 5130. The light emitting devices 5130 may be connected in series, parallel, or series-parallel through circuits formed on the circuit board 5100.

The dam part 5150 is formed on the circuit board 5100. The dam part 5150 divides the region on the circuit board 5100 into a plurality of blocks. The plurality of light emitting devices 5130 may be disposed in each block. For example, in the illustrated exemplary embodiment, four light emitting devices 5130 are disposed in each block. However, the inventive concepts are not limited thereto, and more or less light emitting devices 5130 than four may be disposed in each block.

The dam part 5150 may include a reflective material that reflects light generated by the light emitting devices 5130 and may be made of, for example, white silicon.

The molding part 5170 fills blocks partitioned by the dam part 5150. The molding part 5170 may be made of transparent silicon. The dam part 5150 and the molding part 5170 may include silicon of the same series, and may be made of, for example, phenyl or methyl-based materials. Since the dam part 5150 and the molding part 5170 contain the same type of silicon, bonding force between the molding part 5170 and the dam part 5150 may be improved.

A diffusion film 5190 is disposed on the molding part 5170. The diffusion film 5190 diffuses light generated by the light emitting devices 5130 to spread the light evenly. The diffusion film 5190 may be adhered to the molding part 5170, but is not limited thereto, and may be spaced apart from the molding part 5170. The diffusion film 5190 may be formed as one sheet or a plurality of sheets. Various other layers, such as layers 5210, 5230 and 5250 may be formed between the diffusion film 5190 and the display panel 5270.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A compound of the general formula (I):

$$A_2N_{1-x}M_xO_{2x}X_{6-2x} \qquad \text{(I)}$$

doped with Mn(IV), wherein:

A is at least one selected from the group consisting of Li, Na, K, Rb, Cs, Cu, Ag, Tl, and $NH_4$;

N is at least one selected from the group consisting of Si, Ge, Sn, Ti, Pb, Ce, Zr, Ru, Ir, Pr, and Hf, M is at least one selected from the group consisting of W, Cr, Mo, Te, and Re;

X is at least one selected from the group consisting of F, Cl, Br, and I; and $0<x<1$.

2. The compound according to claim 1, represented by the general formula (II):

$$A_2N_{1-x-y}M_xO_{2x}X_{6-2x}\text{:}Mn(IV)_y \qquad \text{(II), wherein:}$$

A is at least one selected from the group consisting of Li, Na, K, Rb, Cs, Cu, Ag, Tl, and $NH_4$;

N is at least one selected from the group consisting of Si, Ge, Sn, Ti, Pb, Ce, Zr, Ru, Ir, Pr, and Hf;

M is at least one selected from the group consisting of W, Cr, Mo, Te, and Re;

X is at least one selected from the group consisting of F, Cl, Br, and I;

$0<x<1$;

$0<y\leq 0.5$; and $x+y<1$.

3. The compound according to claim 1, wherein the index x is $0.02\leq x\leq 0.05$.

4. A process for preparing a compound according to claim 1, comprising the steps of:

a) preparing a solution or suspension comprising A, M, N, and Mn in an AX-containing solution;

b) stirring the suspension or the solution; and c) separating the solid obtained from the suspension or the solution.

5. A radiation-converting mixture comprising the compound according to claim 1.

6. The radiation-converting mixture according to claim 5, further comprising one or more further luminescent materials selected from conversion luminophores and/or semiconductor nanoparticles.

7. A light source comprising at least one primary light source and at least one compound according to claim 1.

8. The light source according to claim 7, wherein the primary light source comprises a luminescent Indium Aluminum Gallium Nitride material.

9. The light source according to claim 8, wherein the luminescent Indium Aluminum Gallium Nitride is a compound of the formula $In_iGa_jAl_kN$, and wherein $0\leq i$, $0\leq j$, $0\leq k$, and $i+j+k=1$.

10. A lighting unit comprising at least one light source according to claim 7.

* * * * *